United States Patent
Bai et al.

(10) Patent No.: US 7,562,323 B1
(45) Date of Patent: Jul. 14, 2009

(54) SYSTEM, METHOD AND COMPUTER PROGRAM PRODUCT FOR HANDLING SMALL AGGRESSORS IN SIGNAL INTEGRITY ANALYSIS

(75) Inventors: Xiaoliang Bai, La Jolla, CA (US); Igor Keller, Pleasanton, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 274 days.

(21) Appl. No.: 11/417,862

(22) Filed: May 4, 2006

Related U.S. Application Data

(63) Continuation-in-part of application No. 10/735,123, filed on Dec. 12, 2003, now Pat. No. 7,359,843.

(60) Provisional application No. 60/752,518, filed on Dec. 20, 2005, provisional application No. 60/504,127, filed on Sep. 19, 2003.

(51) Int. Cl.
*G06F 17/50* (2006.01)

(52) U.S. Cl. .............................................. 716/5; 703/2

(58) Field of Classification Search ...................... None
See application file for complete search history.

(56) References Cited

U.S. PATENT DOCUMENTS

| | | | |
|---|---|---|---|
| 6,253,361 B1 | 6/2001 | Buch | |
| 6,378,109 B1 * | 4/2002 | Young et al. | 716/4 |
| 6,405,348 B1 * | 6/2002 | Fallah-Tehrani et al. | 716/4 |
| 6,499,131 B1 * | 12/2002 | Savithri et al. | 716/5 |
| 6,507,935 B1 * | 1/2003 | Aingaran et al. | 716/5 |

(Continued)

OTHER PUBLICATIONS

Oh et al., "Effificient Representation of Multi-bit Data Bus Structures by Symmetric Two-Line Models," 2002 IEEE, pp. 141-144.*

(Continued)

*Primary Examiner*—Leigh Marie Garbowski
(74) *Attorney, Agent, or Firm*—Stephen C. Durant; Duane Morris LLP

(57) ABSTRACT

A method, system and computer program product for determining aggressor-induced crosstalk in a victim net of a stage of an integrated circuit design is provided. The methodology can include combining a plurality of aggressor nets to construct a virtual aggressor net, determining a current waveform induced on the victim net by the plurality of small aggressor nets, and modeling a current waveform induced by the virtual aggressor on the victim net based on the contribution of the current waveforms determined for the plurality of small aggressor nets. In a further embodiment, the methodology can also comprise evaluating an effect of an aggressor net on a victim net; and including that aggressor net in the virtual aggressor net if its effect is below a predetermined threshold. The effect evaluated by the methodology can, for example, be the height of a glitch induced on the victim net by a transition in the aggressor net. Additionally, the aggressor net can be included in the virtual aggressor net if the height of the glitch it induces on the victim net is less than a predetermined factor of the supply voltage. Switching probability can be used to compute a 3-sigma capacitance value, and this value can be used to limit the number of small aggressors included in the virtual aggressor net. The combined currents of the aggressor in the virtual aggressor net can be modeled using a piece-wise linear analysis.

19 Claims, 15 Drawing Sheets

U.S. PATENT DOCUMENTS

| | | | |
|---|---|---|---|
| 6,510,540 B1 * | 1/2003 | Krauter et al. | 716/4 |
| 6,536,022 B1 * | 3/2003 | Aingaran et al. | 716/5 |
| 6,587,815 B1 | 7/2003 | Aingaran et al. | |
| 6,718,530 B2 * | 4/2004 | Kim et al. | 716/6 |
| 6,772,403 B1 * | 8/2004 | Sasaki | 716/6 |
| 6,799,153 B1 * | 9/2004 | Sirichotiyakul et al. | 703/19 |
| 6,836,873 B1 * | 12/2004 | Tseng et al. | 716/4 |
| 7,065,720 B2 | 6/2006 | Croix | |
| 7,181,716 B1 * | 2/2007 | Dahroug | 716/13 |

OTHER PUBLICATIONS

Sasaki et al., "Multi-Aggressor Relative Window Method for Timing Analysis Including Crosstalk Delay Degradation," IEEE 2000 Custom ICs Conference, pp. 495-498.*

Blaauw et al., (Apr. 2003) "Driver Modeling and Alignment for Worst-Case Delay Noise," *IEEE Transactions on Very Large Scale Integration (VLSI) Systems*, 11(2):157-166.

Chen et al., (Oct. 2002) "Analytical Models for Crosstalk Excitation and Propagation in VLSI Circuits," *IEEE Transactions on Computer-Aided Design of Integrated Circuits and Systems*, 21(10):1117-1131.

Phadoongsidhi et al., (Nov. 2002) "A Concurrent Fault Simulation for Crosstalk Faults in Sequential Circuits," *Proceedings of the 11th Asian Test Symposium*, pp. 182-187.

Sasaki et al., (May 2003) "Crosstalk Delay Analysis of a .13-um Node test Chip and Precise Gate-Level Simulation Technology," *IEEE Journal of Solid-State Circuits*, 38(5):702-708.

Arunachalam et al., "TACO: Timing Analysis With Coupling", ACM 2000, 4 pgs.

Chen et al., "Miller Factor for Gate-Level Coupling Delay Calculation", IEEE, International Conference on Computer Aided Design, 2000, 7 pgs.

Croix et al., "Blade and Razor: Cell and Interconnect Delay Analysis Using Current-Based Models", DAC Jun. 2-6, 2003, Anaheim CA, pp. 386-389.

Dartu et al., "Calculating Worst-Case Gate Delay Due to Dominant Capacitance Coupling", DAC 1997, Anaheim CA, 6 pgs.

Gross et al., "Determination of Worst-Case Aggressor Alignment for Delay Calculation", ACM 1998, pp. 212-219.

Keller et al., "A robust cell-level crosstalk delay change analysis", 8 pgs, IEEE 2004.

Keller et al., "On a robust noise-on-delay cell-level analysis", 7 pgs.

Odabasioglu et al., "PRIMA: Passive Reduced-Order Interconnect Macromodeling Algorithm", IEEE Transactions on Computer Aided Design of Integrated Circuits and Systems, vol. 17, No. 8, Aug. 1998, pp. 645-654.

Raghavan et al., "AWESpice: A General Tool for the Accurate and Efficient Simulation of Interconnect Problems", 29th ACM/IEEE Design Automation Conference, paper 6.3, 1992, pp. 87-92.

Shepard, "Design Methodologies for Noise in Digital Integrated Circuits", 35th Design Automation Conference, ACM 1998, 6 pgs.

Sirichotiyakul et al., "Driver Modeling and Alignment for Worst-Case Delay Noise", IEEE Trans. on Very Large Scale Integration v. 11, No. 2, Apr. 2003, 6 pgs.

Zolotov et al., "Noise Propagation and Failure Criteria for VLSI Designs", IEEE 2002, 8 pgs.

Keller, Igor et al., "A robust cell-level crosstalk delay change analysis," Institute of Electrical and Electronic Engineers, Nov. 8, 2004, New York, New York, U.S.A., pp. 147-154.

* cited by examiner

SYSTEM, METHOD AND COMPUTER PROGRAM PRODUCT FOR HANDLING SMALL AGGRESSORS IN SIGNAL INTEGRITY ANALYSIS

CROSS REFERENCE TO RELATED APPLICATIONS

This is a continuation in part of U.S. Ser. No. 10/735,123, filed on Dec. 12, 2003, which claims the benefit of priority under 35 U.S.C. § 119(e) to 60/504,127, filed on Sep. 19, 2003, and this application claims the benefit of priority under 35 U.S.C. § 119(e) to U.S. provisional application Ser. No. 60/752,518, filed on Dec. 20, 2005. The contents of these applications are incorporated by reference herein.

FIELD OF THE INVENTION

The present invention relates generally to signal integrity analysis, and more particularly to a system and method for handling small aggressors in signal integrity analysis.

BACKGROUND OF THE INVENTION

Advances in processing technology and demands for greater complexity at reduced cost and power-consumption points have lead to continual increases in densities. As geometries scale signal paths become closer together, a side effect of this scaling is that coupling capacitance between wires becomes the dominant portion of the total wire capacitance. See, K. L. Shepard, "Design methodologies for noise in digital integrated circuits", *Proceedings of the Design Automation Conference*, pages 94-99, June 1998; and F. Dartu, L. Pileggi, "Calculating worst-case gate delays due to dominant capacitance coupling", *Proceedings of the Design Automation Conference*, pages 46-51, June 1997. At the same time, the signal transition times have become faster resulting in stronger aggressors on adjacent victim wires. See, F. Dartu et al, supra. Another side effect of process advancement is the faster scaling of cell internal delay than the interconnect delay, making accurate analysis of interconnect delay important.

With the manufacturing processes moving into the nanometer technology domain for very large scale integrated (VLSI) circuits, signal integrity (SI), or the ability for signals transmitted and processed by an electrical system to tolerate a certain level of noise interference, has become extremely important to the success of the manufactured VLSI product. As such, immunity is turning into a metric of the same importance as power, area and timing because it directly influences all of them.

When neighboring nets switch, the coupling capacitors cause a transfer of charge between them. Depending on the relative times and directions of switching, the amount of crosstalk noise varies. The net that is affected by the noise is known as a victim net, while the neighboring nets that affect it are known as aggressor nets. Noise faults may manifest themselves as functional noise faults, or glitches, in which victim nets take incorrect values. They may also manifest themselves as delay noise faults in which correct transitions on victim nets are delayed or sped up. FIG. 1A is a diagram illustrating one example of a circuit where functional noise, or a glitch 4, is induced on the victim net 12 due to a rising transition 6 on the aggressor net 10. The glitch 4 causes a fault 2 at the output of the victim net 12. FIG. 1B is a diagram depicting an example of delay noise 16 induced on the victim net. In the example illustrated in FIG. 1B, a rising transition 8 on the victim net 12 is slowed down or delayed as a result of a falling transition 14 on the aggressor net 10.

Thus, the crosstalk can have two major effects in modern digital circuits: (i) it can cause a strong glitch on a logically static signal, which may lead to functional fault if the glitch is sampled, and (ii) it can impact arrival time of a signal transition by speeding it up or slowing it down. The importance of the crosstalk effects has grown significantly with recent technology advances. For example, crosstalk delay has become a more prominent element of timing analysis during integrated circuit design due to factors such as, (i) increase in coupling-to-total capacitance ratio, (ii) decrease in supply voltage resulting in a reduction of gate overdrive (iii) shortening of clock period causing transition waveforms to play a bigger role, and (iv) tighter timing margins requiring more accurate timing analysis and less overestimation of delay.

Delay calculation in the presence of crosstalk typically involves finding a worst-case delay among possible aggressor alignments and aggressor waveforms. Determination of delay in the presence of aggressor-induced noise is a challenging task due to factors such as, (i) delay being sensitive to aggressor/victim alignment, (ii) linear models for switching drivers potentially being inaccurate due to drastic variation of impedance during transition, (iii) effective capacitance principle requiring modification (See, F. Dartu et al, supra), and (iv) waveforms potentially becoming nonmonotonic in the presence of noise, making the conventional metric of delay measurement non-robust.

In view of the sensitivity of crosstalk delay to factors such as, aggressor alignment, the nonlinearity of drivers, and aggressor timing window constraints, a search for the worst-case (WC) alignment may be approached using constrained nonlinear optimization techniques. However, optimization in a multidimensional space of aggressor alignments with each iteration requiring simulation of a nonlinear circuit can be prohibitively expensive. The crosstalk delay analysis task is further complicated by the potential for a unique waveform response of each receiver of a victim net to a given input transition, such that a WC aggressor alignment for one receiver may not be the same for another.

Another challenge with analyzing a crosstalk induced delay change arises from the potential for crosstalk to distort a victim switching waveform. A distorted waveform may deviate from the input waveforms used in delay characterization of a receiving gate, resulting in inaccuracy in slew dependent delays in a downstream logic cone. If the crosstalk impact is severe, the victim waveform may even become non-monotonic (bumpy), the effect of which may not be properly modeled in existing gate delay systems.

There have been prior proposals for analysis of crosstalk induced delay. R. Arunachalam, K. Rajagopal, and L. Pileggi. Taco, "Timing analysis with coupling". *Proceedings of the Design Automation Conference*, pages 266-269, June 2000 teach that static timing analysis (STA) can be used to calculate delay while accounting for effects of switching aggressors using a heuristic-based Miller factor, which is applied to coupling capacitance before it is grounded. This approach is believed to be too conservative and inaccurate to be successfully used for modern design constraints.

Another approach is based on computation of a noisy transition—transition in the presence of switching aggressors, and using it for determining new slews and delays. In several studies the linear superposition principle was applied to the nominal transition with a noisy waveform on the victim net computed separately. See, F. Dartu, et al., supra.; R. Arunachalam, et al. supra; and P. D. Gross, R. Arunachalam, K. Rajagopal, and L. Pileggi, "Determination of worst-case aggressor alignment for delay calculation", *Proceedings of the ICCAD*, pages 212-219, November 1998. The nominal transition is computed using a linear Thevenin model for the victim driver with all aggressors kept quiet. The alignment between nominal transition on the victim and transitions on the aggressors was chosen based on noise pulse width and height. However, since the noise wave was computed for a quiet victim driver and not a switching one, the alignment used in the mentioned studies could be inaccurate.

S. Sirichotiyakul, D. Blaauw, C. Oh, R. Levy, V. Zolotov, and J. Zuo, "Driver modeling and alignment for worst-case delay noise", *Proceedings of the Design Automation Conference*, pages 720-725, June 2001, proposed that alignment between the victim and aggressors should be determined using characteristics of a receiving gate. The proposed approach is based on a pre-characterized 4-D look-up table representing alignment as a function of nominal slew rate, noise peak and width on the victim net and output load of receiving gate.

Current-based models for gates have been proposed. See, J. F. Croix, and D. F. Wong, "Blade and Razor: Cell and Interconnect Delay Analysis Using Current-Based Models", In *Proceedings of the Design Automation Conference*, 386-391, June 2003; and V. Zolotov, D. Blaauw, S. Sirichotiyakul, M. Becer, C. Oh, R. Panda, A. Grinshpon and R. Levy, "Noise propagation and failure criterion for VLSI designs" *Proceedings of the ICCAD*, pages 587-594, November 2002. However, there is no teaching of how such current model is to be integrated in a flow of crosstalk delay change analysis.

FIGS. 3A and 3B illustrate one aspect of a conventional methodology for measurement of aggressor-induced crosstalk delay. FIG. 3A is an illustrative drawing of a set of curves that represent victim signal transitions from VDD to ground. Each curve represents a different alignment of a victim signal transition with an aggressor signal. In each case, the aggressor signal induces a bump in the victim signal transition. The curves are non-monotonic due to the aggressor-induced bumps. Victim net signal transition delay is measured in terms of the time at which the victim signal crosses the $V_{ref}$ level. The curves of FIG. 3A illustrate that an aggressor-induced bump can cause the victim signal to cross $V_{ref}$ multiple times. A second crossing increases the measured victim signal transition delay according to the conventional methodology, since the delay should be measured based on the latest crossing of $V_{ref}$.

FIG. 3B is an illustrative drawing of a curve representing victim signal transition delay versus aggressor alignment. The heavy dots on the delay curve denote corresponding crossing times of $V_{ref}$ on the noisy transitions shown in FIG. 3A. The curve of FIG. 3B shows that victim signal transition delay depends upon aggressor alignment. Unfortunately, the non-monotonic waveforms of FIG. 3A result in a 'cliff' in the curve of FIG. 3B methodology. The last curve in FIG. 3A does not have a bump crossing $V_{ref}$, which engenders the cliff in delay curve in FIG. 3B. This prior methodology is not robust because even a relatively small change in a circuit parameter (e.g., driver size, supply voltage, etc) and/or aggressor alignment on a particular victim net can result in a disproportionate change in measured victim signal delay due to such cliff.

Because the crosstalk can cause two types of effect as outlined above, it is desired that there be two signal integrity analyses for signoff: (i) crosstalk glitch (functional noise) analysis, and (ii) noise-on-delay analysis. Both forms of signal integrity analysis can be computationally costly, and often affect the time-to-market characteristics of design methodology. The most expensive parts of a signal integrity analysis tend to be (i) RC reduction and (ii) solving the reduced network. The run time of the mentioned process grows superlinearly as the number of aggressor nets increases. There is a need, therefore, for an efficient and relatively accurate method of handling a larger number of small aggressors.

Modeling of small aggressors accurately and efficiently is an important factor in quality of noise and noise-on-delay analysis. A popular approach to modeling the high number of small aggressors is based on Virtual Aggressor (VA). The VA modeling consists of two major aspects: Modification of coupled RC network, where small aggressors are "lumped" into a single node representing a virtual aggressor, and construction of a driver model for the virtual aggressor, which is required for calculation of a response on the victim and contribution of virtual aggressor into noise.

Lumping multiple aggressors into a single virtual aggressor is schematically depicted in FIG. 2. As shown in this Figure, all the coupling capacitors connecting the small aggressors, $a_1$-$a_n$, and the victim net, V, are reconnected to the Virtual Aggressor VA. While one of the capacitors' terminals are "lumped" together, the other terminals are still distributed on the victim net. In addition to reconnecting the capacitors, their value can be reduced by a factor taking into account a low probability that all the small aggressors will switch at the same time and in a certain direction.

One of the first implementations of the virtual aggressor concept was done several years ago in Cadence's SI analysis tool CeltIC. It allowed a significant improvement of CeltIC's run time mainly due to a much lower number of aggressor nets and parasitic elements in the net complex. At the same time, the initial implementation of VA in CeltIC suffered from several significant drawbacks resulting in additional inaccuracy of the analysis.

One technique for determining whether an aggressor can be included in a virtual aggressor is based on the magnitude of its impact on the victim. Particularly, the aggressor net is included in the virtual aggressor if the height of the glitch it causes on a victim is less than a predetermined factor of the supply voltage. For example, the aggressor net is included into the virtual aggressor if:

$$H < G_{tol} * Vdd.$$

Here Vdd is supply voltage on the victim net and $G_{tol}$ is a user-defined parameter. Generally speaking, the larger the value selected for $G_{tol}$, the greater the number of aggressors included in the virtual aggressor. If the aggressor net is not below this threshold, it remains a distinct aggressor.

Because the timing restrictions on transitions on the aggressor nets can limit the impact an aggressor has on the victim, conventional virtual aggressor methodologies apply timing window limitations to the capacitive modification process. These timing window restrictions are conventionally used to restrict the total added capacitance. However, because timing window limitations are calculated in advance, they do not take into account the dynamic nature of such limitations. As such, they can become overly pessimistic and expensive.

BRIEF SUMMARY OF THE INVENTION

According to one embodiment of the invention, a method for determining aggressor-induced crosstalk in a victim net of a stage of an integrated circuit design is provided. The method in this embodiment comprises combining a plurality of small aggressor nets to construct a virtual aggressor net, determining a current waveform induced on the victim net by the plurality of small aggressor nets, and modeling a current waveform induced by the virtual aggressor on the victim net based on the contribution of the current waveforms determined for the plurality of small aggressor nets. In a further embodiment, the method can also comprise evaluating an effect of an aggressor net on a victim net; and including that aggressor net in the virtual aggressor net if its effect is below a predetermined threshold. The effect evaluated by the method can, for example, be the height of a glitch induced on the victim net by a transition in the aggressor net. Additionally, the aggressor net can be included in the virtual aggressor net if the height of the glitch it induces on the victim net is less than a predetermined factor of the supply voltage.

In a further embodiment, modeling the current waveform of the virtual aggressor comprises combining the current waveforms of the plurality of small aggressors. The current waveforms can be combined, for example, in a piecewise linear fashion. Additionally, modeling the current waveform of the virtual aggressor can be accomplished, for example, by determining a virtual aggressor function $f_{va}(T)$ such that $$f_{va}(T) = \frac{1}{C_{va}} \int_0^T \left( \sum_{k=1}^n C_k \frac{df_k(t)}{dt} \right) dt,$$

where $C_{va}$ is the capacitance of the virtual aggressor, $C_k$ is the capacitance of the k-th of n aggressors, and $f_k(t)$ is a function of the k-th aggressor.

The effects of the aggressor nets can be filtered using time-window filtering, and further refined using a selecting window. In one embodiment, a selecting window is defined by a temporal distance from a time of interest associated with the victim net. In one embodiment, a worst case scenario is assumed for aggressor transitions within the aggressor's timing window. Additionally, coupling capacitance for the aggressor nets can be accumulated in the virtual aggressor and the cumulative result filtered by discarding a capacitance that is more than 3-σ away from a Gaussian mean of the switching capacitance.

In accordance with yet another embodiment of the invention, the various features, aspects and functionality of the invention can be implemented using a computer program product on a computer-readable medium, where the computer program product includes a program comprising instructions operable to cause a programmable processor to determine aggressor-induced crosstalk in a victim net of a stage of an integrated circuit design.

Further features and advantages of the present invention, as well as the structure and operation of various embodiments of the present invention, are described in detail below with reference to the accompanying drawings.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 3A is an illustrative drawing of a set of curves that represent the impact of different aggressor alignments with a victim signal; and FIG. 3B is an illustrative drawing of a curve representing victim signal transition delay versus aggressor alignment for the curves of FIG. 3A.

DESCRIPTION OF THE PREFERRED EMBODIMENTS

Figure 1A:
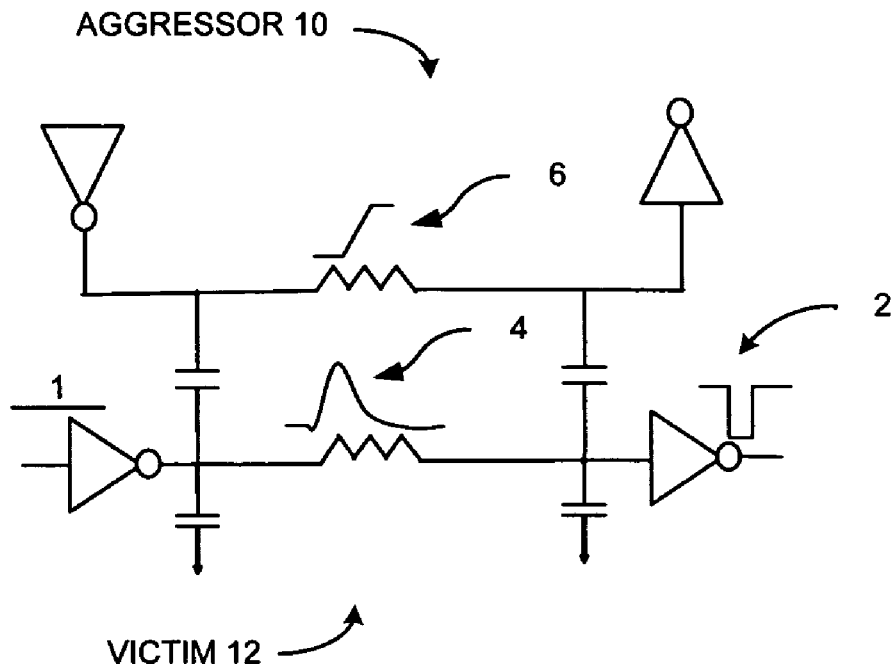
FIG. 1A is a diagram illustrating an example of circuit where functional, or glitch, noise is induced on the net victim due to rising transition on the aggressor net.
Figure 1B:
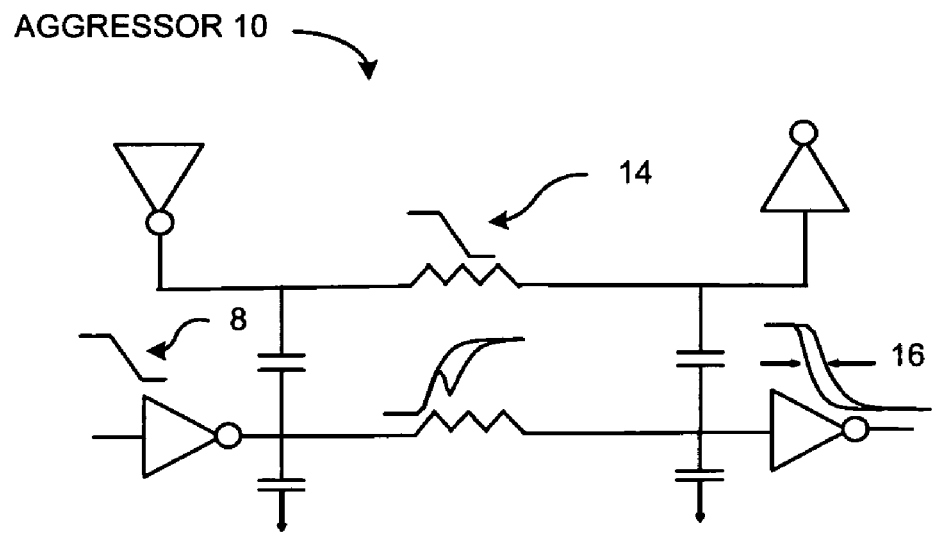
FIG. 1B is a diagram illustrating an example of delay noise induced on a victim.
Figure 2:
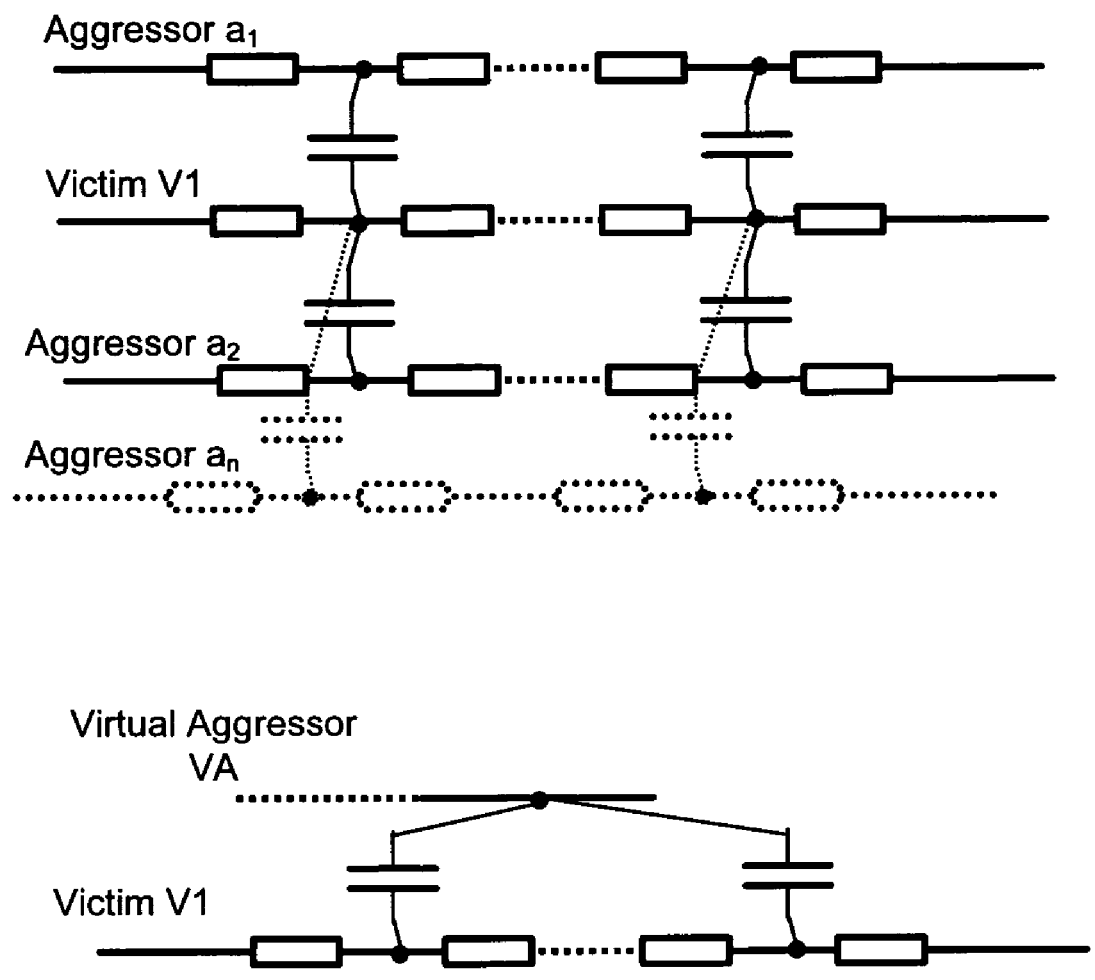
FIG. 2 is a diagram illustrating an example of lumping multiple small aggressors into a virtual aggressor.
Figure 3A:
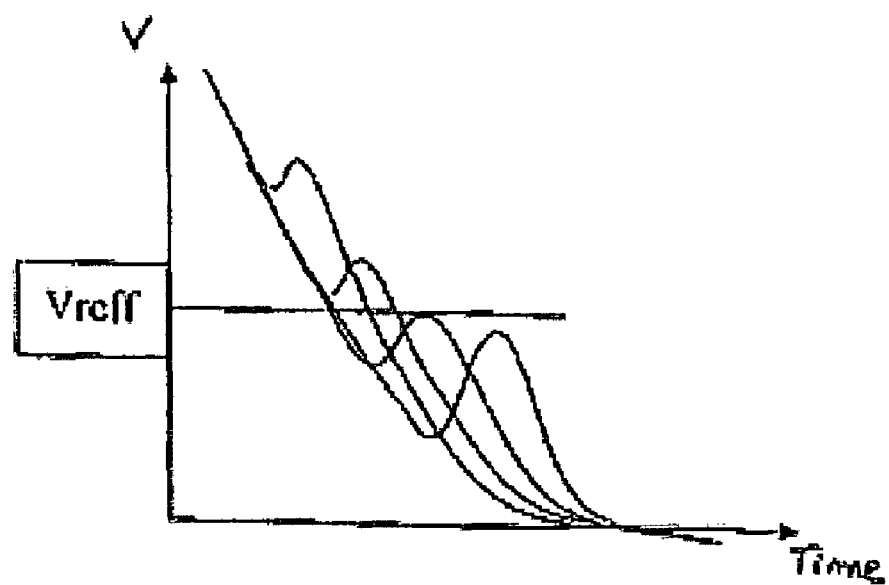
FIGS. 3A and 3B represent a conventional methodology for measurement of aggressor-induced crosstalk delay.
Figure 3B:
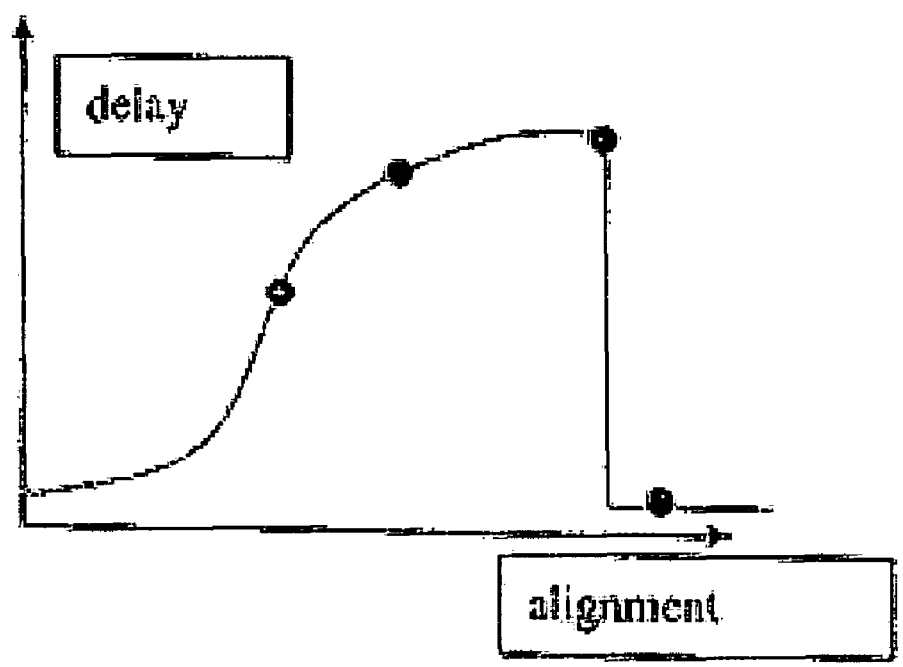

The present invention provides a novel method and apparatus for crosstalk analysis for use during integrated circuit design, evaluation and testing. Crosstalk between a victim net and an aggressor net can induce a signal delay change or other unwanted behavior in the victim net. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Introduction

As used herein, a net basically consists of the wires that interconnect components in an integrated circuit design. For instance, a net may interconnect one or more drivers with one or more receivers. Such drivers and receivers may comprise any one or more of a variety of types of components such as, NAND, AND, NOR, OR or INVERT gates, for example. Each of these interconnected components typically is modelled as a cell in an integrated circuit (IC) design. Thus, for example, a cell model of an INVERT gate in an IC design specifies the performance characteristics of an actual INVERT gate in an actual IC. A reference in a design to a particular type of component (e.g., gate) actually references a cell model for the gate.

A victim net is a net for which crosstalk delay change is to be analyzed. An aggressor net is a net that is coupled through parasitic capacitance to the victim net. A stage is a victim net, its aggressor nets and their driving gates. It will be appreciated that a given net may be characterized as a victim net at one point in a timing analysis and may be characterized as an aggressor net at other points in the timing analysis.

Crosstalk delay change is a difference between crosstalk delay and nominal delay. Crosstalk (stage) delay change is the extra delay in a victim net state change (switching from logic 0 to 1 or from logic 1 to 0) induced by transitioning of some or all aggressors of the victim net. In general, for crosstalk delay analysis, the maximum of crosstalk delay change (taken absolute value) is of greatest interest. The delay change is positive when victim and aggressors switch in opposite directions and it is used for late arrival time calculation (often referred to as max delay analysis). Similarly, the delay change is negative when victim and aggressors switch in opposite directions and it is used for early arrival time calculation (often referred to as min delay analysis). Nominal (stage) delay is a stage delay when aggressors are held quiet (logical 0 or 1).

Figure 4:
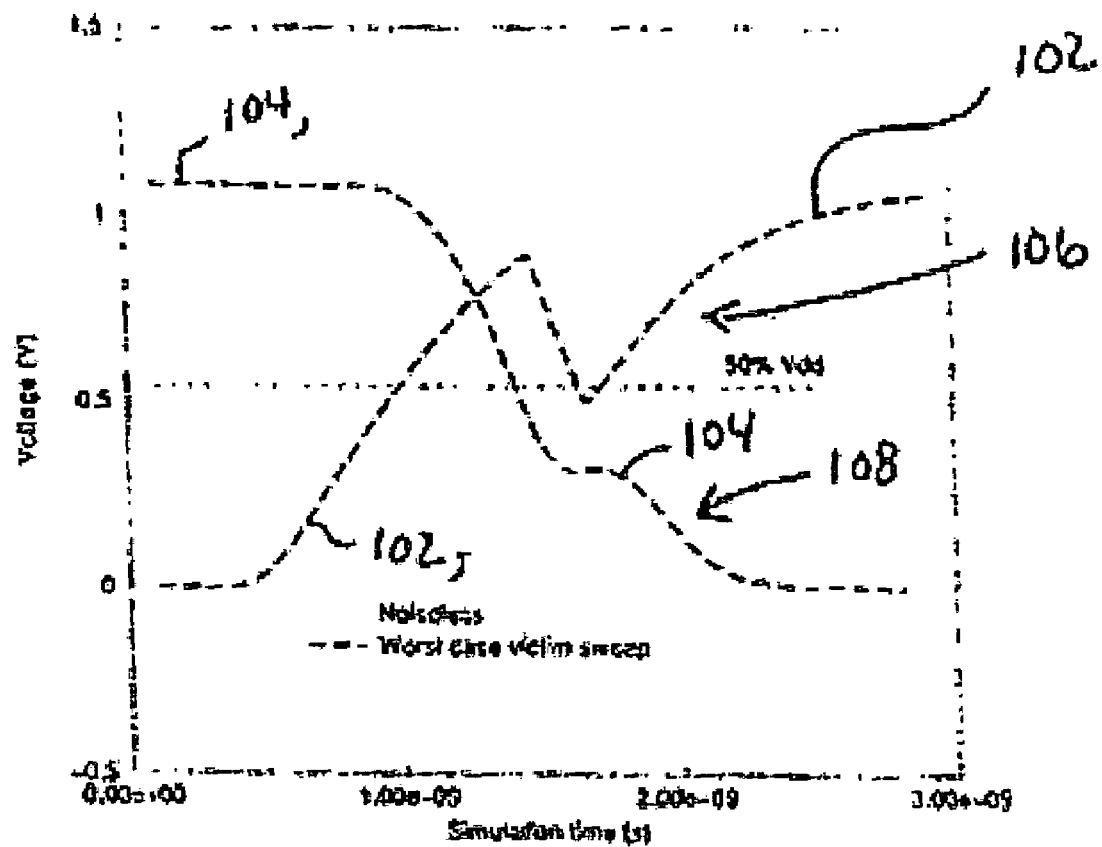
FIG. 4 is a signal diagram illustrating an example of a type of problem associated with aggressor alignment and delay measurement based on a predefined waveform crossing threshold.

FIG. 4 is a diagram illustrating an example of the type of problem associated with aggressor alignment and delay measurement based on a predefined waveform crossing threshold. Waveform 102 is provided on a victim receiver input. Waveform 104 is the waveform produced at the victim receiver's output as a result of a given input. Waveforms 102 and 104 are noisy (i.e., impacted by aggressors). The receiver gate in this example is an inverter. The waveforms in the example are computed in Spice using an exhaustive sweep of alignment parameters on a victim net in a 0.13 micron industrial design. The worst-case delay pushout when measured at the 50% Vdd crossing is 724 ps (Typically, $V_{ref}$ is chosen as 50% Vdd, but sometimes, especially when skewed gates dominate, it is less than that). This can happen when a rising receiver input waveform 102 has a falling noise bump 106 that barely touches the threshold and then rises again. However, this bump on the receiver input waveform 102 causes almost no delay change in the receiver output waveform 104 where the transition has only a slight bump 108 at the end. The receiver, a CMOS gate, in essence acts as a low pass filter, thereby smoothing the signal. Thus, aggressor alignment based on a conventional delay metric (50% Vdd crossing) applied to the bumpy transition on the victim net is clearly too pessimistic. Measurement of transition time using a $V_{ref}$ crossing time of the non-monotonic waveform is non-robust and can lead to non-unique results.

Figure 5:
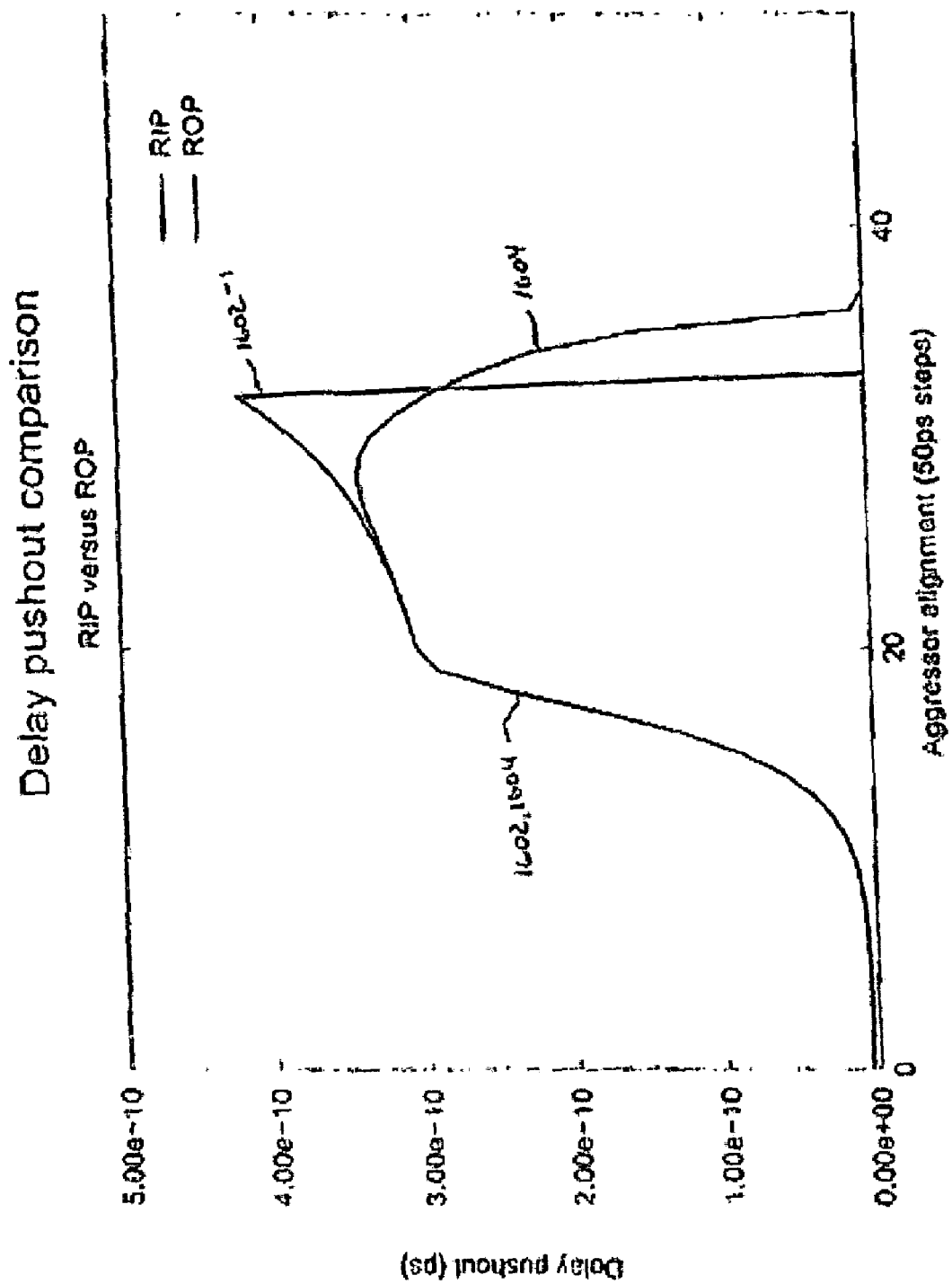
FIG. 5 is a diagram illustrating two pushout delay measurement curves obtained from a series of Spice simulations with a single aggressor, which is aligned differently with respect to the victim transition in each simulation; one curve represents a conventional technique involving receiver input measurement of $V_{ref}$ crossing, and another represents a technique in accordance with an embodiment of the co-pending '123 application involving receiver output measurement and optimized aggressor alignment.

FIG. 5 presents two curves showing delay pushout measurements that are obtained using a series of Spice simulations, where aggressor transition alignment is varied relative to the victim transition. Curve 1602 shows an example of delay pushout measurement using a prior Receiver Input Probe (RIP) technique and $V_{ref}$ crossing methodology. Note the cliff portion 1602-1. Curve 1604 represents a more robust pushout measurement using a Receiver Output Probe (ROP) technique and alignment optimization in accordance with an embodiment of the invention.

Stage with Victim Net and Aggressor Nets

Figure 6:
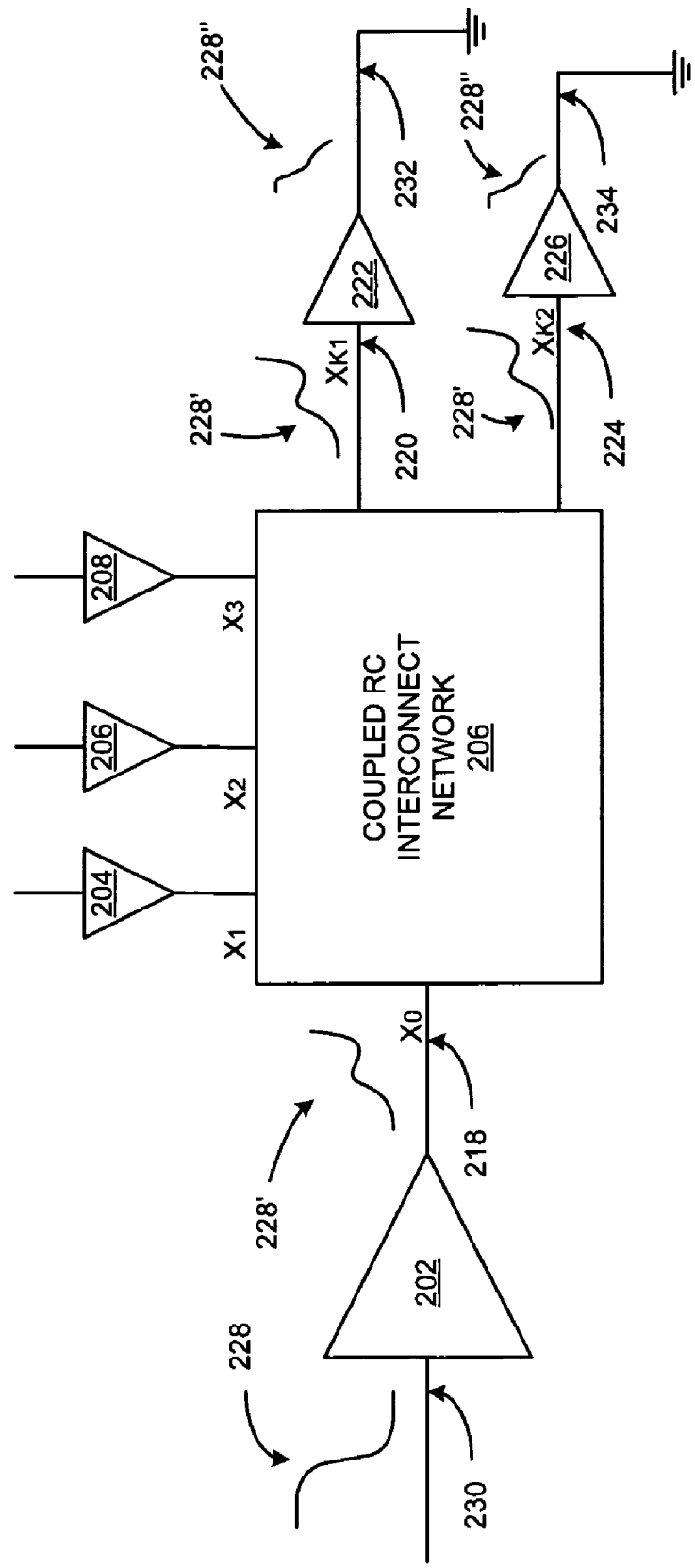
FIG. 6 is an illustrative simplified drawing of a stage showing an interconnect network that can be represented by a computational model and associated receivers in accordance with an embodiment of the invention.

FIG. 6 is a simplified drawing of a stage driving first and second receivers 222, 226. The stage includes a victim net driver 202 and aggressor net drivers 204-208. The stage also includes an interconnect network 206, which is a network connecting victim net driver 202, aggressor net drivers 204-208 and receivers 222, 226. The victim net and aggressor net are said to be "coupled" to denote they are electrically connected through coupling capacitors. This is to distinguish resistively connected components of the circuit (connected by resistive wire). The stage further includes a victim net driver output node 218 that connects the victim net driver 202 with the interconnect network 206. The stage also includes a first receiver input node 220 and a second receiver input node 224. The first receiver input node 220 connects the interconnect network 206 to the first receiver 222. The second receiver input node 224 connects the interconnect network 206 to the second receiver 226.

During circuit operation, the victim net driver 202 may propagate an input signal transition 228 from a victim net driver input node 230 to the victim net driver output node 218. The coupling between victim net and aggressor nets represented by interconnect network 206 makes it possible that aggressor net driver transitions on one or more aggressor nets can influence signal level on the victim net. Such aggressor-induced signal level changes, or aggressor crosstalk, can change the time required for a signal transition to propagate from victim net driver to a receiver connected to the victim net. Specifically, for example, crosstalk delay change on the victim net may ensue when the victim net driver 202 causes transitions on the victim net from one logic state to another during a time frame when one or more aggressor nets also transition from one logical state to another. If aggressor nets are switching in the opposite direction to that of victim net, crosstalk effects increases signal propagation delay from victim net driver output 218 to respective victim net receiver inputs 220, 224. Conversely, if victim and aggressor nets are switching in the same direction, crosstalk effects decrease signal delay. Thus, aggressor crosstalk delay change involves changes in victim net signal propagation time due to aggressor net switching.

In the illustrated example, the driver 202 has inverted the signal 228 to produce signal 228'. Also in this example, signal 228' is shown to be somewhat distorted due to the effects of aggressor nets upon the victim net. Usage of conventional delay measurement technique in the case of distorted signals can cause significant inaccuracy in terms of path delay. The ability to identify and propagate such a non-monotonic waveform of a transitioning signal during timing analysis of an electronic circuit design is one novel feature of the present invention.

The interconnect network 206 propagates the signal 228' from the victim net driver output node 218 to the first and second victim net receiver input nodes 220, 224. The first victim net receiver 222 propagates the signal 228' from the first victim net receiver input node 220 to a first victim net receiver output node 232. The second victim net receiver 226 propagates the signal 228' from the second victim net receiver input node 224 to a second victim net receiver output node 230. In this example, the receivers 222, 226 invert signal 228' so as to produce signals 228" Also in this example, signals 228" are shown to be somewhat smoothed due to low pass effects of receivers 222, 226.

Figure 7:
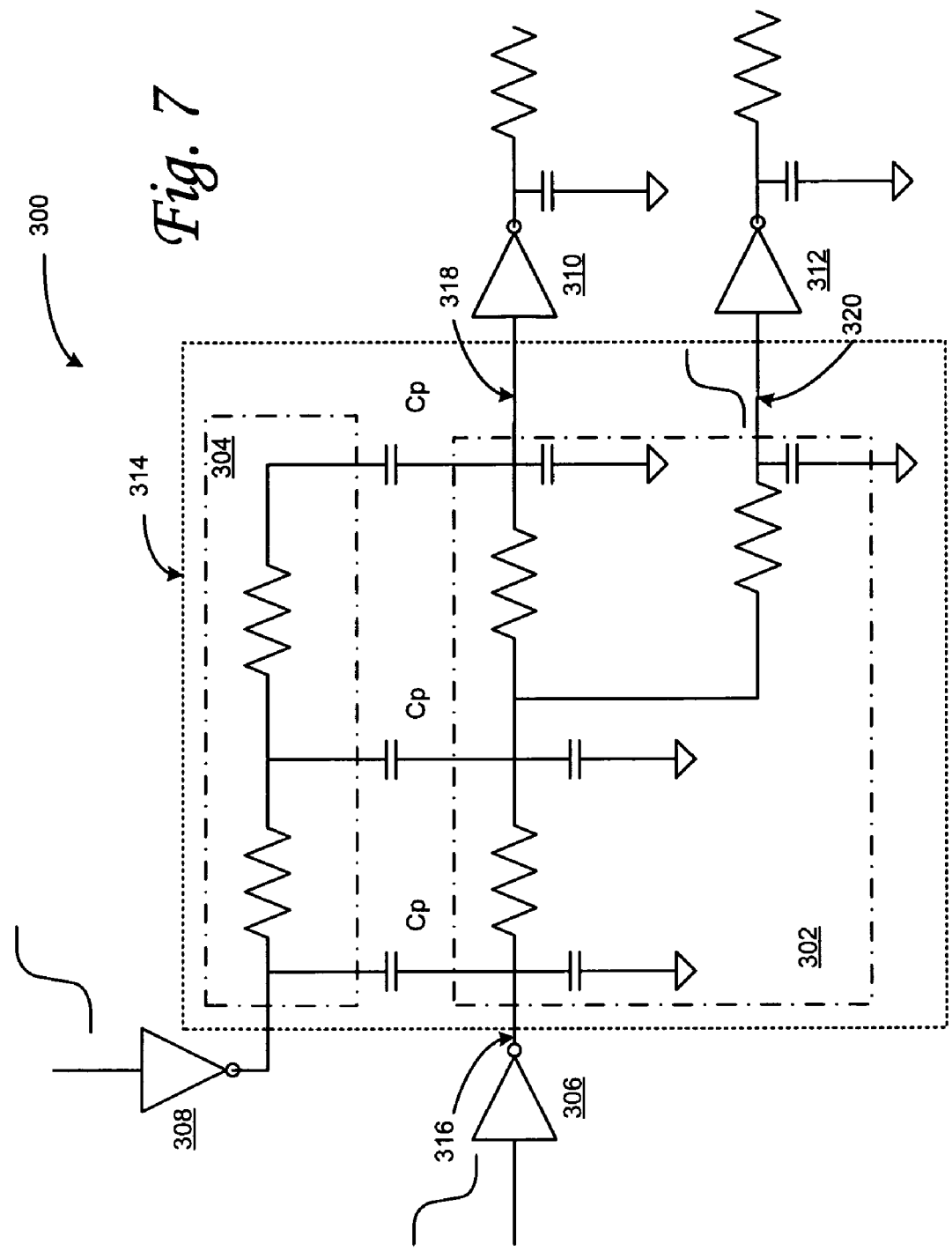
FIG. 7 is a more detailed illustrative simplified drawing of a stage showing capacitive coupling between a victim net and an aggressor net in accordance with an embodiment of the invention.

FIG. 7 is a more detailed illustrative drawing of a stage 300 that includes a victim net 302 and a single aggressor net 304. A victim net driver 306 is connected to drive the victim net 302. An aggressor net driver 308 is coupled to drive the aggressor net 304. Parasitic capacitances $C_P$ couple the victim and aggressor nets 302, 304. The victim net 302 is connected to two receivers 310, 312. Dashed lines 314 enclose an interconnect network 314 comprising victim net 302 and aggressor net 304. In operation, signals are propagated through the interconnect network 314 from an output node 316 of victim net driver 306 to respective input nodes 318, 320 of receivers 310, 312. It will be appreciated that in order to avoid obscuring this disclosure in unnecessary detail, only a single aggressor net 304 is shown. In a typical stage, however, a victim net may be impacted by multiple aggressors, sometimes ten or more of them. Moreover, to simplify the description, the victim net 302 is shown to have only a single driver 306 and to be connected to only two receivers 310, 312, although an actual victim net may have several drivers and connections with more than two receivers.

The effect of a switching aggressor on a victim is often proportional to the slew rate of transition of the aggressor. In one embodiment, rising edge slew rate is defined as time required for a rising signal to transition from a predefined low voltage threshold, $Vdd*K_{L1}$ to a predefined high voltage threshold, $Vdd*K_H$, and then divided by the factor $(K_H-K_L)$. Similarly, the falling edge slew rate is defined as time required for a falling signal to transition from $Vdd*K_H$ to $Vdd*K_{L1}$, and then divided by the factor $(K_H-K_L)$. Typical values for the thresholds are $K_H=0.8$, $K_L=0.2$ Indeed, the effect of aggressor cross talk on victim's steady state or transition times can be roughly proportional to signal transition rates on aggressors (slew rates), that in turn are proportional to effective load seen by the aggressors' drivers. That is, the slew rate on an aggressor can depend on the strength of drivers holding the aggressor's neighbors (i.e., second-order aggressors). Crosstalk delay change is a result of switching neighboring nets (aggressors) upon switching transition time on the victim net.

As used herein, a first order aggressor net is an aggressor net that has a significant crosstalk influence on a given victim net. A second order aggressor is an aggressor net that has significant influence upon a transition waveform (or slew rate) on a first order aggressor of the given victim net. It is possible that an aggressor net may serve as both a first order aggressor and a second order aggressor relative to a given victim net.

Pre-Computing Aggressor Waveforms

Figure 8:
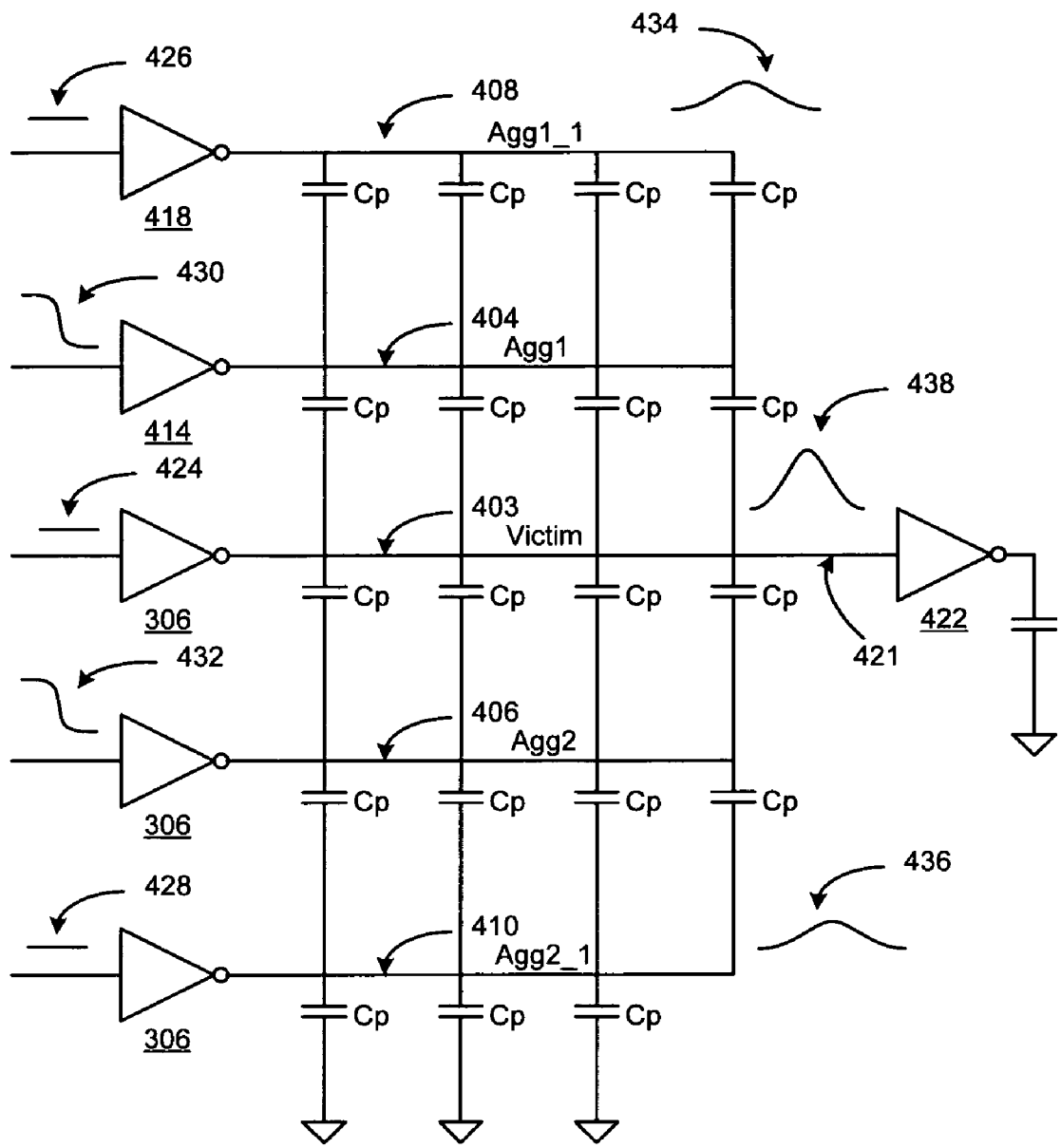
FIG. 8 is diagram illustrating an example stage that includes a victim net, two first order aggressor nets, and two second order aggressor nets.

FIG. 8 is diagram illustrating an example stage that includes a victim net 403, two first order (victim's nearest neighbor) aggressor nets 404 (agg1), 406 (agg2) and two second order (first order aggressors' nearest neighbors) aggressor nets 408 (agg1_1), 410 (agg2_1). Victim net driver 412 is connected to drive victim net 403. Respective aggressor net drivers 414-420 are respectively coupled to drive aggressor nets 404-410. The victim net 403 is connected to an input node 421 of receiver 422. The respective victim and aggressor nets are coupled as shown by parasitic capacitances $C_P$. Parasitic resistors are omitted from the figure for the sake of clarity.

FIG. 8 illustrates a possible effect of transitions on the respective first order aggressor nets 404, 406 upon signal level on the victim net 403 and upon signal levels on the respective second order aggressor nets 408, 410. In this example, input signals to the victim and second order aggressor net drivers 412, 418, 420 are held constant 424, 426, 428 while input signals on first order aggressor net drivers 414, 416 are switched 430, 432. As a result of parasitic coupling capacitance $C_P$ between respective pairs of first and second order aggressors, respective signal fluctuations 434, 436 occur on each of the second order aggressor networks 408, 410, and victim net (which can be considered as an aggressor to aggressor nets). The fact that the second order aggressors and the victim net are present and are grounded through some finite holding resistance has a significant effect on the transition rate (slew rate) of transition on the aggressor nets.

It will be appreciated that the network of FIG. 8 is a significantly simplified relative to large and complex interconnect networks of some actual integrated circuit designs. A given victim net may have multiple first order aggressors. A given first order aggressor net may have multiple second order aggressor nets. It will be further understood that crosstalk delay change analysis through simulation of a large and complex interconnect network, especially one with non-linear (models of) aggressor drivers, could be prohibitively expensive.

Piece-Wise Linear Approximation of Pre-Computed Aggressor Waveforms

In a present embodiment, pre-computed fast transition waveforms (two for each aggressor net—rising and falling) are stored and represented by time-value pairs, and approximating a smooth transition in a piece-wise linear (PWL) fashion. Generally, the more pieces used in the PWL wave, the more accurate the approximation is. In accordance with one aspect of the invention, a multiple piece PWL wave is used in delay change analysis to model transitions on the aggressors. The use of multi-piece PWL can significantly improve accuracy of the noise and change calculation.

In general, a linear saturated ramp ordinarily is used by typical conventional timing analysis tools to model a transition on an aggressor net. The ramp can be viewed as a PWL waveform consisting of only one piece, which physically describes an averaged slew rate of the transition. A ramp representation of real signal transition with only a one-piece PWL wave has been used in timing tools for reasons such as the following. (1) accuracy of (linear) driver model generally has been too low to accurately capture details of a signal transition other then averaged slew rate; (2) the transition times typically were small compared to clock period of modern VLSI designs, such that a detailed description of transition was not especially important; and (3) storing a PWL wave ordinarily requires a relatively significant amount of memory, since 2 single-precision numbers usually are needed for each piece, which typically takes about 8 bytes of memory.

In contrast, a methodology in accordance with one embodiment of the invention can be based on generation, storage and usage of multi-piece PWL waveforms accurately approximating fast transitions on aggressor nets. As noted before, using a realistic waveform in the voltage source modeling aggressor transition can be a significant factor in improving accuracy of delay change analysis compared to conventionally used linear ramp. One advantage of the use of detailed (realistic) waveform is improved accuracy of analysis. However, storage of detailed wave for all pins of design may not be practical since it could require huge amount of memory.

Virtual Aggressor Modeling

Now described is an approach for virtual aggressor modeling in accordance with one embodiment of the invention. This embodiment is based on matching both total coupling capacitance and current injected by all small aggressors. In order to match the total injected current for different signal integrity analysis types while still accounting for timing and logic constraints. In one embodiment, the second part of the virtual aggressor modeling—the one which defines a driver model for the virtual aggressor—is done right before the actual analysis is performed.

In one embodiment the excitation waveform can be generated using a process comprising three elements: selection of small aggressors; creation of a net complex; and generation of VA driver model for different analysis and alignment methods. One or more embodiments for these elements are now described.

As stated, in one embodiment only small aggressors are lumped into the virtual aggressor net, while larger aggressors are treated discretely. Thus, where the effect of an aggressor net on a victim is above a predetermined threshold, that aggressor net can remain a distinct aggressor and may not be lumped into the virtual aggressor net. On the other hand, where the effect of an aggressor net is sufficiently small, it is lumped with other small aggressors into a virtual aggressor net. In this manner the treatment and handling of numerous small aggressors can be simplified.

Figure 9:
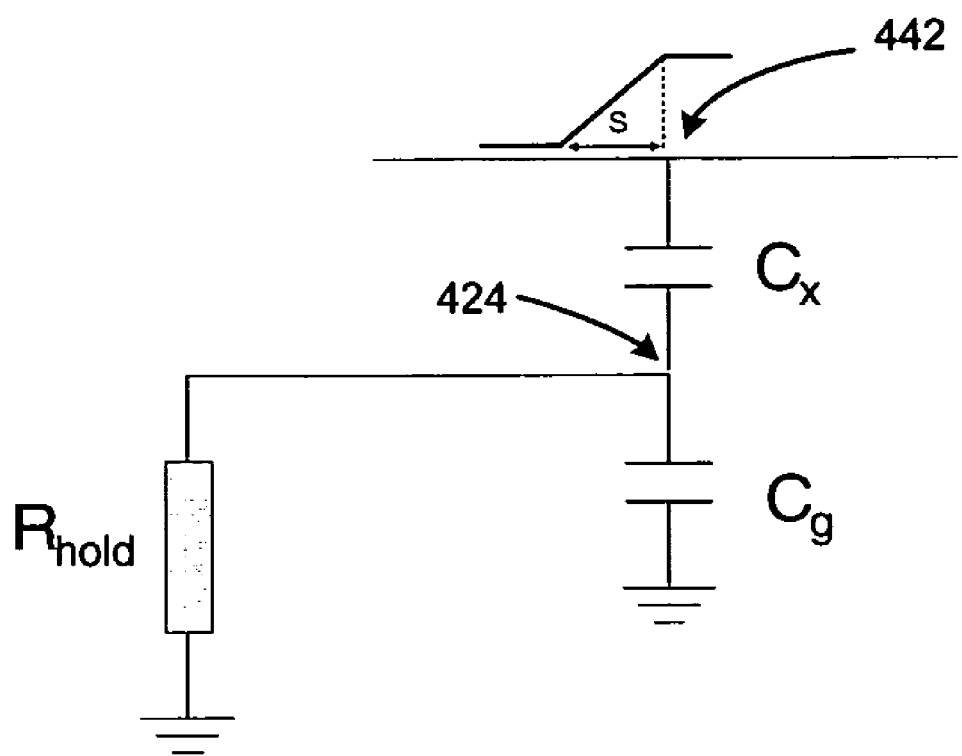
FIG. 9 is a diagram illustrating a model for determining the height of a glitch on the victim.

The definition of a small aggressor can be based, in some instances, on a glitch estimation using a lumped model of a victim/aggressor pair. In particular, in one embodiment the height of the glitch on the victim, H, can be analytically determined from a simple model. FIG. 9 is a diagram illustrating a model that can be used to determine the height of a glitch on the victim in accordance with the relationship set for in equation (1). Referring now to FIG. 9, the aggressor net in question is represented by node 422. A transition at node 422 will result in glitch H on the victim net, at node 424. The height of the glitch, H, induced on the victim is given by:

$$H = \frac{C_x}{S} R_{Hold} \left(1 - e^{\frac{S}{Rhold\,(C_x+C_g)}}\right) \quad (1)$$

S is the slew on node 422, which is the minimum of the fastest rising and falling slews on the aggressor net; $R_{Hold}$ is a holding resistance, which in one embodiment is maximal resistance of the victim's driver at either at high or low state, $C_x$ is coupling capacitance between victim 424 and the aggressor net 422, and $C_g$ is the ground capacitance of the victim net.

As stated above, the aggressor net can be included in the virtual aggressor if its contribution or effect on the victim is relatively small. In one embodiment, the aggressor net is included into the virtual aggressor if the height of the glitch it causes on a victim is less than a predetermined factor of the supply voltage. For example, the aggressor net is included into the virtual aggressor if:

$$H < Hthresh \quad (2)$$

where Hthresh is a user defined parameter.

In one embodiment, the glitch height is normalized by supply voltage, Vdd, and Hthresh is the product of a user-defined parameter, $G_{tol}$, and Vdd, although other thresholds are possible. In one embodiment, $G_{tol,\;can\;be\;set\;at}$ 0.05, although other values are possible. Generally speaking, the larger the value selected for $G_{tol}$, the greater the number of aggressors included in the virtual aggressor. Where equation (2) is true, the aggressor becomes a virtual aggressor component. Otherwise, it remains a distinct aggressor. Thus, in this example where $G_{tol}$=0.05, if the glitch is less than five percent of the supply voltage level Vdd, that aggressor is lumped into the virtual aggressor net.

Utilizing capacitance matching alone, however, can result in an underestimation of the actual glitch due to any of several reasons. First, a linear slew is used to estimate glitch height and actual slews are rarely, if ever, linear. This can impact the analysis because, in some instances, a realistic waveform having same slew as the linear ramp can cause higher glitch.

Second, the victim resistance, which is neglected by this capacitance matching solution, can in some instances shield part of the ground capacitance, and, in some cases, the actual glitch can be even higher than the ratio of the coupling capacitance to the total capacitance, Cx/Ctot. Additionally, $R_{hold}$, in reality, can behave in a nonlinear fashion and grow with glitch height.

Therefore, setbacks associated with capacitance matching can include: Possible over-optimism of glitch estimation (shielding ignored, linear slew, nonlinear $R_{hold}$ ignored); Cliff in virtual aggressor capacitance in timing window iterations due to overlap-based timing window filtering; Pessimism of virtual aggressor analysis due to conservative assumptions made during timing window filtering (Edge-alignment is not supported); Linear ramp is used for a virtual aggressor during analysis; Reconstruction of virtual aggressor for a victim net required on subsequent timing iterations.

Furthermore, not all aggressors transition in the same direction and at the same time. As such, accumulating the affects of all of the small aggressors in the virtual aggressor net using a simple combination would more than likely result in an overestimation of the cumulative effect of the aggressors that make up the virtual aggressor. Therefore, after the virtual aggressor components have been identified, the virtual aggressor's coupling capacitance (respectively, capacitors of the modified network) can, in one embodiment, be reduced by a factor that is calculated using a statistical method. One embodiment uses a 3-σ method to determine the amount by which to reduce the cumulative contribution of small aggressors.

In addition to the 3-σ method, the cumulative effects of a virtual aggressor can be further reduced using time-window filtering, which is described in more detail below. With this filtering, a maximal subset of compatible (overlapping) small aggressors can be found, and the rest of small aggressors can be grounded. Additionally, conventional virtual aggressor analysis assigns two slews (rising and falling) that are either set by a user or found through averaging of slews over the virtual aggressor components. These slews can be used to model the transition on the VA in the form of a linear saturated ramp.

To avoid some or all of the setbacks associated with the above methodologies, one embodiment of the invention generates an excitation waveform that more accurately reflects the anticipated contribution of the virtual aggressor net. Use of the excitation waveform in modeling and analysis can be done in combination with the above capacitance matching (or other) solutions of adjusting the affects of the coupling capacitance.

In one embodiment, generating an accurate excitation waveform can be accomplished by matching the total noise current injected by the virtual aggressor components. In one embodiment, current-matching based virtual aggressor methodologies can take into account not only the total coupling capacitance of small aggressors, but also the current injected from virtual aggressor components. In order to achieve better accuracy, current-matching-based virtual aggressor methodologies can utilize any of several innovative techniques described herein, either alone or in various combinations.

Figure 10:
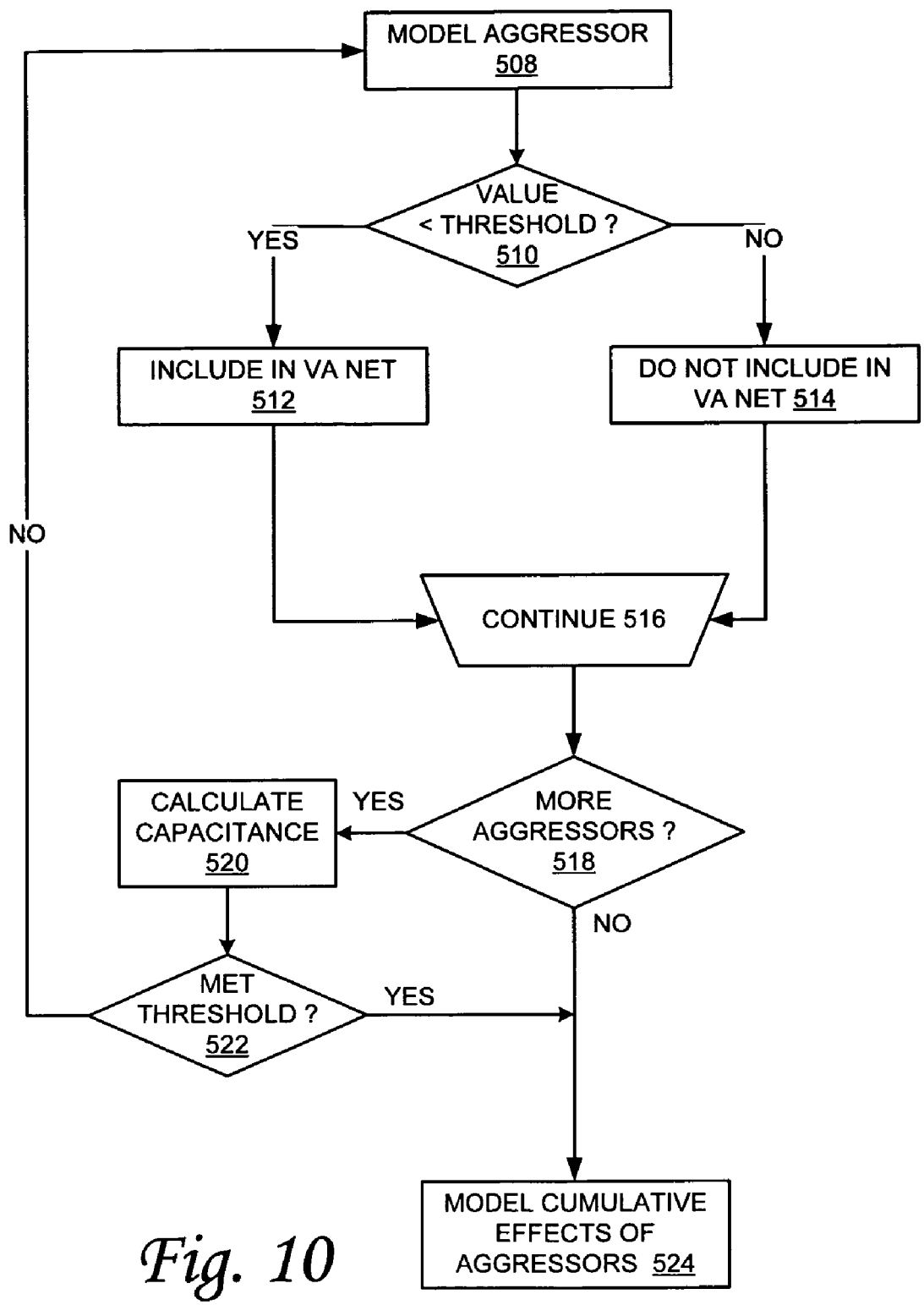
FIG. 10 is an operational flow diagram illustrating an example process for accumulating aggressor contributions to model a virtual aggressor current waveform in accordance with one embodiment of the invention.

FIG. 10 is a diagram illustrating an example process for estimating noise current injected by a virtual aggressor in accordance with one embodiment of the invention. In FIG. 10, in blocks 508-520, a virtual aggressor is constructed. Then, in block 524, the current effects of the virtual aggressors on the victim can be modeled to estimate the cumulative effect of the aggressors on the victim.

Referring now to FIG. 10, in block 508, a glitch in a victim net caused by an aggressor is estimated using a simplified capacitance model. For example, a 1-pole model utilizing a simple RC circuit model can be used. In one embodiment, a similar circuit to that illustrated in FIG. 9 can be used as the simplified model to estimate the effect of a glitch from an aggressor. Referring again to FIG. 9, consider that a gate (not illustrated) driving the victim net is attempting to hold a voltage level at node 424. For example, a driver may be attempting to hold a logic level zero or a logic level one. As a further example, in some technologies, the gate would be attempting to hold a level of approximately either zero volts or Vdd at node 424. Further consider that a transition on an aggressor net would have the effect, at least to some extent, of pulling the voltage at node 424 up or down from the level at which the driver is attempting to hold the node.

Also consider that the gate driving node 424 typically has an impedance value associated therewith. This gate output impedance is usually much higher than the net impedance. This gate output impedance is represented by the modeled value $R_{hold}$ in the simplified model illustrated in FIG. 9. As a simplified model, in one embodiment $R_{hold}$ can be approximated as a linear resistance, even though a driver may not always exhibit a linear output impedance across its operating range. Also, one embodiment neglects the resistance of the victim net.

In block 510, it is determined whether the glitch is below a given threshold. For example, in one embodiment, this threshold can be calculated as given above in Equation (2). If so, it is included in the virtual aggressor net. If not, it can be treated as a distinct aggressor. This is illustrated by blocks 512, 514 and 516. This threshold analysis process can be performed for each individual aggressor to determine whether it should be included in the virtual aggressor as illustrated by a block 518.

Due to the nature of signals and systems, it would be a rare coincidence for all aggressor nets to contribute positively to a given glitch or delta delay in a victim. In other words, it would be rare for all aggressors of a given victim to switch at the same time, in the same direction. Statistically speaking, the larger the number of aggressors associated with a given victim, the less likely that all of the aggressors will switch at the same time and in the same direction. Therefore, it would be overly pessimistic to assume total additive contributions by all aggressors. To account for this, in one embodiment, the accumulated capacitance can be checked as aggressors are accumulated to determine whether the accumulated capacitance is below a predetermined threshold, $C_{thresh}$ each time an aggressor with a glitch less than a certain threshold is included into virtual aggressor. This is illustrated by blocks 520 and 522.

In one embodiment, to avoid an overly pessimistic result, this threshold analysis can be done based on switching probabilities and a 3-σ method described below. In this embodiment, small aggressors can be accumulated until the total capacitance of the virtual aggressor reaches the determined threshold value $C_{thresh}$, and this threshold can be set to approximately the $C_{3-\sigma}$ value (defined below), for example. This total capacitance calculated in block 520 can be used as the total effective capacitance between the virtual aggressor and the victim. In another embodiment, the accumulation of small aggressors is not limited to a $C_{thresh}$ value. In this alternative embodiment, the capacitances of the accumulated aggressors can be multiplied by a factor to reduce the total capacitance to the $C_{3-\sigma}$ or other threshold value.

Then, in block 524, transitions from the multiple small aggressors are accumulated to model the total effect of the aggressors on the victim. The contribution of each of the aggressors in the virtual aggressor net is estimated using the above-described model. In one embodiment, the contribution of each aggressor is modeled, using the same coupling capacitance, $C_x$, as this is the total coupling capacitance between the nets. More particularly, in one embodiment the victim net current that is induced by each small aggressor in the virtual aggressor net is measured. This can be accomplished by exciting the aggressor node, and measuring the current through the capacitor $C_x$.

In one implementation of block 524, the induced current waveforms that are attributable to each modeled aggressor, can be combined to determine the total estimated contribution of the virtual aggressor (i.e., the combined contribution of its components). In other words, in one embodiment the system can estimate what the waveform from the virtual aggressor node would be when all capacitors are connected, based on the current waveform contributions as contributed by all the aggressors that make up the virtual aggressor. This can be accomplished in one embodiment by integrating the sum of the currents. These waveforms can be combined in a piecewise linear fashion, as described in greater detail, below. As stated above with reference to block 522, one embodiment of the invention uses a 3-σ method to reduce the estimated contribution of aggressors to model a more accurate total contribution. In one embodiment, this 3-σ method assumes that the effective switching capacitance of contributing aggressors is 3-σ away from the mean (or expected) value. This is a simple yet effective mechanism to adjust the estimated total contribution of aggressors on the victim because, for most of the cases, it is sufficient to cover the worst case.

One technique for determining an amount by which to reduce the capacitance of the virtual aggressor based on the number of aggressors uses a probabilistic analysis. The switching events for each aggressor can be modeled probabilistically to determine their likelihood of switching in a particular direction. In one embodiment the technique assumes that a k-th aggressor can switch in a given direction, causing noise with probability $\alpha_k$. Tools that simulate circuit behavior can be used to more accurately predict the probability with which a given aggressor node will either rise, fall or remain constant. Additionally, knowledge one has about performance of a particular circuit may also be used to predict the probability that a given aggressor node will either rise, fall or remain constant. However, where such tools or information are not available, or in embodiments where a simplified analysis is preferred, it can be assumed that each event—a rising transition, a falling transition, and a non-transition—will have an equal probability of occurring for the aggressors.

In one embodiment of the invention, a 3-σ based pessimism reduction can be implemented by applying a factor to the switching capacitance of the victim net. In one embodiment, the 3-σ distance from the mean is measured, and anything beyond the 3-σ distance is assumed to not be sufficiently probable of occurring. Assuming that all aggressors are statistically independent, a Gaussian profile having a mean value and width can be anticipated. With a Gaussian profile, the width characterizes the sigma square value, or how widely the event can spread around mean. The mean, μ, and variance, σ², of the total switching capacitance, Cswitch, are given by:

$$\mu = E(Cswitch) = \sum_{k=1}^{K} \alpha_k C_k \quad (3)$$

$$\sigma^2 = VAR(Cswitch) = \sum_{k=1}^{K} (1-\alpha_k)\alpha_k C_k^2$$

where $C_k$ is the coupling capacitance for the k-th aggressor, for K total aggressors.

The 3-σ threshold for switching capacitance, $C_{3\sigma}$, (as described above, a value for that capacitance that would be 3-σ away from the Gaussian mean of the switching capacitance) can be shown by:

$$C_{3\sigma} = \mu + 3\sigma = \sum_{k=1}^{K} \alpha_k C_k + 3\sqrt{\sum_{k=1}^{K} (1-\alpha_k)\alpha_k C_k^2} \quad (4)$$

Once the probabilities, $\alpha_k$, are known and the capacitance, $C_k$, is known based on material properties and geometries, the $C_{3\sigma}$ capacitance can be computed. As stated above, in one embodiment it can be assumed that all aggressors have an equal probability of rising, falling and being quiet. That is, $\alpha_k = \alpha = \frac{1}{3}$. In this simplified case, the 3-σ factor, $C_{3\sigma}$, becomes:

$$C_{3\sigma} = \mu + 3\sigma = \frac{1}{3}\sum_{k=1}^{K} C_k + \sqrt{2\sum_{k=1}^{K} C_k^2} \quad (5)$$

Note that the assumption α=1 (all aggressor are always switching) automatically yields the linear-summation case. In other words, where the probability is assumed to be one, the result is simply the sum of all capacitors. If the probability of switching is zero, π=0, the total effective capacitance is zero. If the probability is somewhere in between (0<α<1), then the effective capacitance varies between zero and the total additive coupling capacitance.

The factor, $K_{VA}$ can now be found as $$K_{VA} = \frac{C_{3\sigma}}{\sum_{k=1}^{M} C_k}. \quad (6)$$

In one embodiment, all aggressors (large and small) are modeled to derive the probability of effective active capacitance. This embodiment assumes that probabilities are based on all events. Therefore, in this embodiment, $C_{3\sigma}$ is found for all aggressors, then the capacitances for all real aggressors are subtracted out of the total. What is left, then, is applied to the virtual aggressors.

Figure 13:
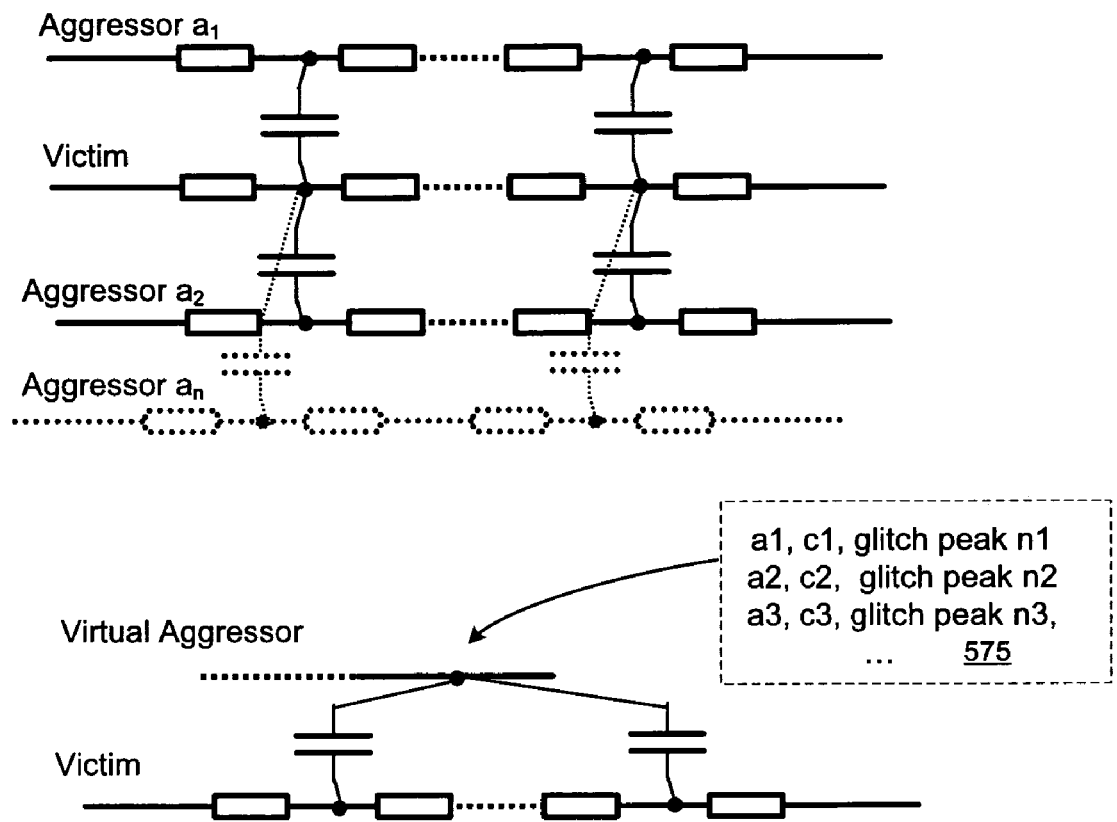
FIG. 13 is a diagram illustrating an example of records that can be kept for a virtual aggressor in accordance with one embodiment of the invention.

In order to perform on-the-fly slew calculations, a virtual aggressor method can be implemented using detailed timing and physical information on virtual aggressor components. Because the number of virtual aggressor components can be extremely large, keeping track of all virtual aggressor components can be computationally expensive and consume large amounts of memory. Therefore, in one embodiment, virtual aggressor components can be tracked and sorted based on factors such as, for example, glitch magnitude. In this embodiment, a subset of one or more (N) components (for example, the most significant components) can be selected for bookkeeping purposes. FIG. 13 is a diagram illustrating an example of records that can be kept for a virtual aggressor in accordance with one embodiment of the invention. Referring now to FIG. 13, an exemplary list 575 is illustrated. The example list 575 includes for each component aggressor, $a_1 \ldots a_n$, an identifier, a capacitance, and the glitch height value. As this example illustrates, other methodologies can be used to track component aggressors and their contributions to the virtual aggressor.

These can be applied using various formulations. For example, one embodiment begins with the aggressor with the largest noise magnitude. The coupling capacitance (to the victim net) for the largest contributor aggressors are accumulated until the total coupling capacitance of selected aggressors reaches a given threshold or the number of aggressors reaches an upper limit (controlled by a parameter va_component_limit). For example, in one embodiment the aggressors are accumulated until the total coupling capacitance of selected aggressors reaches $C_{3\sigma}$.

Piecewise Linear Waveform Calculations

As stated above with reference to FIG. 10, in one embodiment the selected aggressors are combined to model the cumulative effect of the aggressor on the victim. More particularly, in one embodiment a current waveform model is generated to estimate the effects. In order to calculate a contribution to noise on the victim net from the virtual aggressor, a driver model for the virtual aggressor can be used. One model for a switching driver is a Thevenin model, which is widely used in timing and crosstalk analyzers. The Thevenin model can include a voltage source and linear resistor in series, usually found through matching output slew of the driving gate using a timing library. The voltage source of the Thevenin model is usually a saturated ramp. However, the form of the voltage source is a leading-order factor in accuracy of the induced noise. Therefore, one embodiment of the invention uses a voltage source constructed in a way to match the current induced by the virtual aggressor to that from all small aggressors as if they are switched in the worst-case time and direction. Moreover, the Thevenin resistor can be set to zero without a strong impact on accuracy.

For crosstalk, there are six different glitch and noise-on-delay effects—positive glitch, negative glitch, rising speed-up, falling speed-up, rising push-out, falling push-out. An accurate analysis for each noise effect can require consideration on different constraints. Therefore, six different piecewise linear transitions can be calculated for each noise type, respectively. The signals on a node can be either a constant voltage level (↔), a rising transition (↑) or a falling transition (⇓). In one embodiment, each permutation of these possible signals is considered and modeled separately. More particularly, in one embodiment, six combinations are considered as illustrated by the following table:

| VICTIM | AGGRESSOR |
|---|---|
| ↔ | ↑ |
| ↑ | ↑ |
| ↓ | ↑ |
| ↔ | ↓ |
| ↑ | ↓ |
| ↓ | ↓ |

For each of the six possibilities, the worst-case scenario may be different, because the possible alignments can be different. For example, the timing windows for each case can be different. Therefore, for each possibility a different current waveform might be generated, and therefore a different transition for the virtual aggressor model. Thus, in this embodiment, the current waveform is modeled six times, once for each possibility.

In one embodiment, piecewise linear transitions can be calculated based on physical (coupling capacitance, slews) and timing information of the victim and selected virtual aggressor components. A shape of a current injected by virtual aggressor components can be quite nonlinear such that the simple linear ramp used in conventional virtual aggressor methods may not provide sufficient accuracy. Therefore, for better modeling of the total noise current, one embodiment uses a piecewise-linear-based waveform modeling methodology. Ideally, the goal of piecewise linear modeling would be to have noise injected by the virtual aggressor net matching the total noise injected by the set of small aggressors.

The piece-wise linear transitions for the virtual aggressor can be constructed based on physical properties of each small aggressor, such as coupling capacitance and transition time as well as timing constraints. In this embodiment, the piece-wise linear waveform construction can match the current injected by the virtual aggressor to the total current injected by the set of small aggressors.

A methodology for performing a piecewise linear estimation is now described in accordance with one embodiment of the invention. First, this exemplary methodology assumes that the virtual aggressor capacitance, $C_{va}$, is the sum of the capacitance, $C_k$, of the contributing k-th aggressors, over K total aggressors as follows:

$$C_{va} = \sum_{k=1}^{K} C_k \quad (7)$$

In order to determine the piece-wise linear transition on the virtual aggressor, $f_{VA}(t)$, let $f_k(t)$ denote a transition on the k-th aggressor. Matching the current induced by the virtual aggressor to that from all the small aggressors yields a current model, $I_{VA}$, as the following:

$$C_{va} \frac{df_{va}(t)}{dt} = \sum_{k=1}^{K} C_k \frac{df_k(t)}{dt} \quad (8)$$

Solving for the virtual aggressor function, $f_{va}(T)$, yields:

$$f_{va}(t) = \int_0^t \sum_{k=1}^{K} \frac{\tilde{C}_k}{\tilde{C}_{va}} \frac{df_k(t')}{dt'} dt' = \frac{1}{C_{va}} \sum_{k=1}^{K} \frac{\tilde{C}_k}{\tilde{C}_{va}} f_k(t) \quad (9)$$

Therefore, the piecewise linear waveform for a virtual aggressor can be calculated based on equation (9).

Figure 11A:
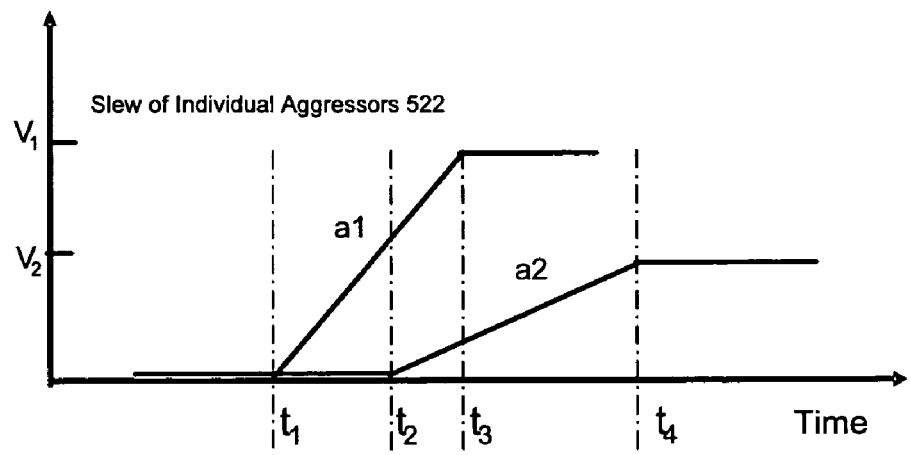
FIG. 11A is a diagram illustrating two example aggressor waveforms.
Figure 11B:
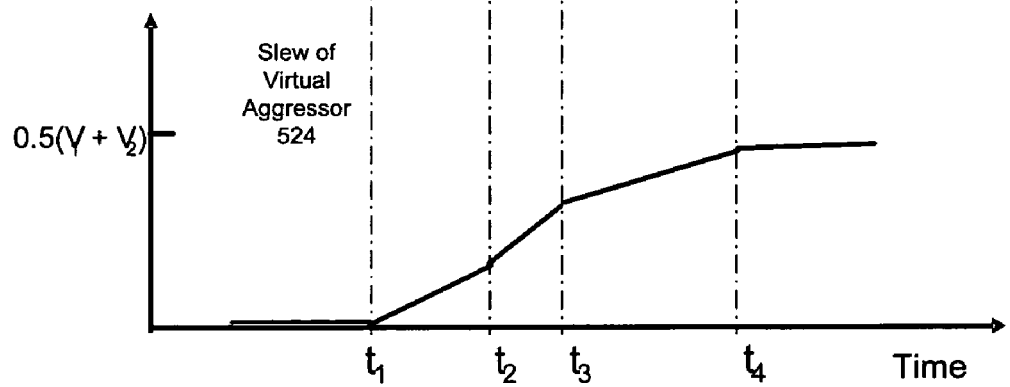
FIG. 11B is a diagram illustrating an example of the two aggressor waveforms of FIG. 11A combined in a piecewise linear fashion in accordance with one embodiment of the invention.

FIG. 11 illustrates a simple example of two aggressor waveforms combined in a piecewise linear fashion in accordance with one embodiment of the invention. The upper half of FIG. 11 illustrates an example slew for two aggressors 522, and the lower half represents the slew for the virtual aggressor 524. Referring now to FIG. 11, in this example two aggressors, $a_1$ and $a_2$, have the same coupling capacitance value, $C_1$. Aggressor a1 switches from ground to voltage $V_1$ in the time interval between times $t_1$ and $t_3$. Aggressor $a_2$ switches from ground to voltage level $V_2$ in the time interval between times $t_2$ and $t_4$.

The piecewise linear combination of aggressors $a_1$ and $a_2$ yields the curve shown in the lower half of FIG. 11, wherein the combined effect transitions from ground to voltage $\frac{1}{2}(V_1+V_2)$ in the time interval between times $t_1$ and $t_4$. The virtual aggressors have the same total coupling capacitance, $2C_1$, and the piecewise linear transition matches total noise current injected from these two virtual aggressor components.

Timing Window Filtering

In some environments, however, switching of aggressors may be confined to particular windows in time. Therefore, one embodiment of the invention considers the timing windows that may constrain one or more of the aggressors. As such the combined current waveform can be more conservative, or pessimistic, than if this constraint were not utilized. Additionally, however, the noise current injected from virtual aggressor components can be unique for each noise type (i.e., for delay changes and glitches). These different noise types can have different timing window constraints. Timing-window-constrained noise analysis can therefore be addressed as an optimization problem, in which the largest possible, or worst-case, noise current is found, subject to set of constraints.

One embodiment applies timing window filtering during virtual aggressor construction. That is, contributions of an aggressor may be filtered during construction of the virtual aggressor, rather than after the fact. However, according to this pre-filtering approach, a virtual aggressor may need to be reconstructed upon the occurrence of a change in timing windows. Additionally, it may be desirable to use the constructed virtual aggressor (with built-in timing windows) in both delay and glitch analyses. However, because delay and glitch analysis may use different timing windows, pre filtering, or advanced definition of timing windows may hinder application. Hence this pre-filtering approach may force the designer to adopt constraints that yield an overly conservative timing-window-overlap filtering.

Therefore, in an alternative embodiment, timing window filtering can be performed for the aggressor components after the virtual aggressor has been constructed. Preferably, this can be done on the fly as the analysis is performed. In this embodiment, a more advanced filtering method, such as, for example, a partial-alignment based filtering method (see below) can be used. This can allow timing windows to change without the need to reconstruct the virtual aggressor. This can also allow the assignment of different timing windows to different types of analysis (for example, glitch analysis, vs delay analysis).

Figure 12:
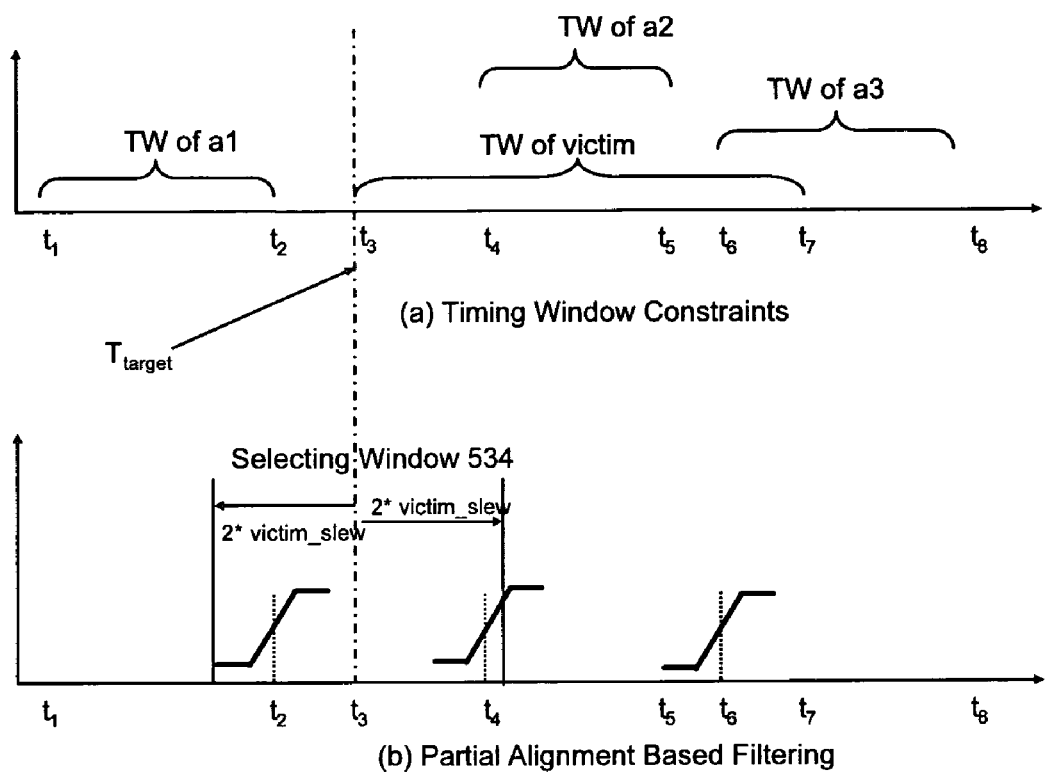
FIG. 12 is a diagram illustrating an example of applying partial-alignment based filtering on virtual aggressor components in accordance with one embodiment of the invention.

FIG. 12 is a diagram illustrating an example of applying partial-alignment based filtering on virtual aggressor components in accordance with one embodiment of the invention. Referring now to FIG. 12, in this example the timing window constraints of the victim and three aggressors (a1, a2, and a3) are as follows:

$$a1 \in (t1, t2)$$
$$a2 \in (t4, t5)$$
$$a3 \in (t6, t8)$$
$$\text{victim} \in (t3, t7) \tag{10}$$

where, $t1 < t2 < t3 < t4 < t5 < t6 < t7 < t8$.

More particularly, in the example illustrated in FIG. 12, examples of timing windows (TWs) in which rising transitions of the victim and three aggressors (a1, a2, and a3), can take place. For example, aggressor a1 is expected to experience a rising transition only during the time window between times $t_1$ and $t_2$; aggressor a2 is expected to experience a rising transition only during the time window between times $t_4$ and $t_5$; aggressor a3 is expected to experience a rising transition only during the time window between times $t_6$ and $t_8$; and the window of interest for the victim is between times $t_3$ and $t_7$.

For early rising delay pushout, the preferred aggressor switching activity should occur close to the left edge of victim's timing window (in other words, near time $t_3$). To arrive at a worst-case analysis, in one embodiment the transition times on each virtual aggressor component are assumed to occur as close to time $t_3$ as their timing window may permit. Therefore, as illustrated in FIG. 12, the rising transition on aggressor a1 is assumed to occur at the end of its respective timing window at time t2, which is the closest possible time to left edge of victim's timing window, $t_3$. Likewise, the rising transition on aggressor a2 is assumed to occur at the beginning of its respective timing window at time t4, which is the closest possible time to left edge of victim's timing window, $t_3$. Alternatively, other embodiments contemplate an analysis that is somewhat more optimistic than a worst-case analysis. Such embodiments can apply statistical or other analysis to set the actual transition time of an aggressor within its permissible window.

Continuing with the example wherein the worst case assumption is made for the aggressor transition, the piecewise linear waveform of the virtual aggressor for early rising delay analysis is now calculated. However, as the example depicted in FIG. 12 illustrates, not all aggressors need to be considered in this process. This is because transitions for some aggressor (even with a worst-case assumption) may not occur close enough to the time of interest (in the example case, close enough the left edge of victim's timing window). If a transition on an aggressor cannot occur close enough to the time of interest, in one embodiment the noise effect can be neglected. This may be because the injected noise current already discharged from the victim net prior to the time of interest (for example, t<<t3), or because it has no impact on the noise waveform because it occurs to late (for example, t>>t3).

Due to RC time constants, and other phenomenon, it is not necessary for an aggressor and victim transition to overlap identically for an effect to be material. Therefore, to determine which, if any, aggressor transitions can be ignored, one embodiment of the invention uses a selecting window that defines temporal bounds around the time of interest in the victim net. That is, the selecting window can define a window of time within which a transition in an aggressor would have an effect on the victim for the given scenario. Thus, in one embodiment, the selecting window is determined such that, if an aggressor switches within the selecting window, then its noise current can contribute to the piecewise linear transition.

In one embodiment, the width of the selecting window is set to be two times the width of the victim's slew, which represents the characteristic time of discharge on the victim net. This relationship can be given by:

$$T_{target} - 2*\text{victim\_slew} \leq t \leq T_{target} + 2*\text{victim\_slew} \tag{11}$$

Here $T_{target}$ is the targeted time for noise generation. For noise-on-delay, it can be equal to the corresponding victim timing window edges (speed-ups use left edge, push-outs use right edge). For glitch analysis, it can be determined by the time that the largest possible noise current can be injected into the victim net.

This is further illustrated with continued reference to FIG. 12. As the example depicted in FIG. 12 illustrates, none of the aggressors timing windows (TW) overlap with the time of interest $t_3$. However, a selecting window 534 is identified around $t_3$ based on the victim's slew rate. Looking within selecting window 534, two aggressors can transition close enough to $t_3$ (in other words, within selecting window 534) to impact the victim in an early rising delay analysis. Because only aggressors a1 and a2 can transition within the selecting window 534, only their contributions are considered in the analysis in this example.

Experimental Results

FIG. 14 is a diagram illustrating scatter plots with a comparison of noise glitch calculated for small (0.01) and default (0.05) $G_{tol}$ values using an industrial design in accordance with one embodiment of the invention. With the smaller $G_{tol}$, more aggressors are kept distinct and the result can be considered as a reference. With larger $G_{tol}$, more aggressors are included into the virtual aggressor and their impact is modeled through the virtual aggressor.

Figure 14A:
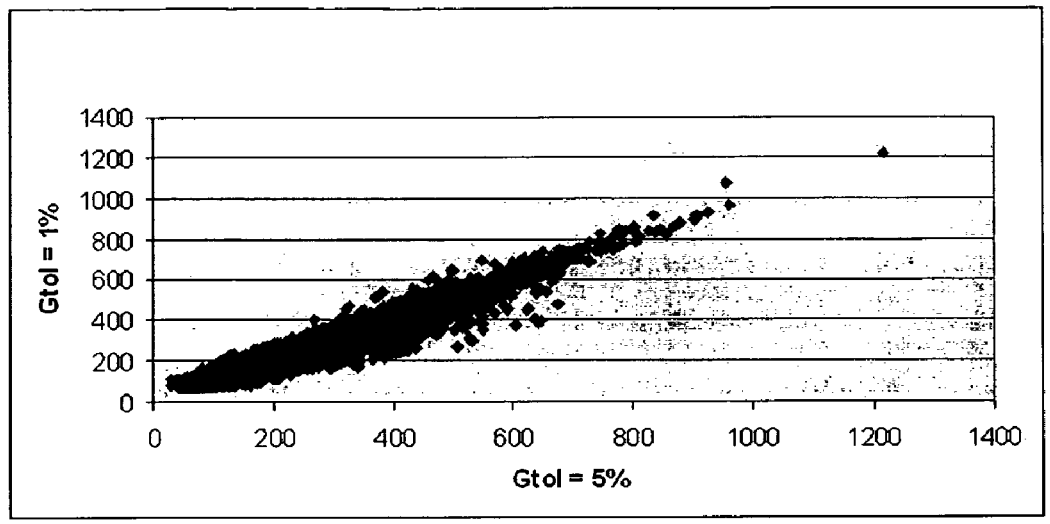
FIGS. 14A and 14B scatter plots with a comparison of noise glitch calculated for small and default user defined ($G_{tol}$) values using an industrial design in accordance with one embodiment of the invention.
Figure 14B:
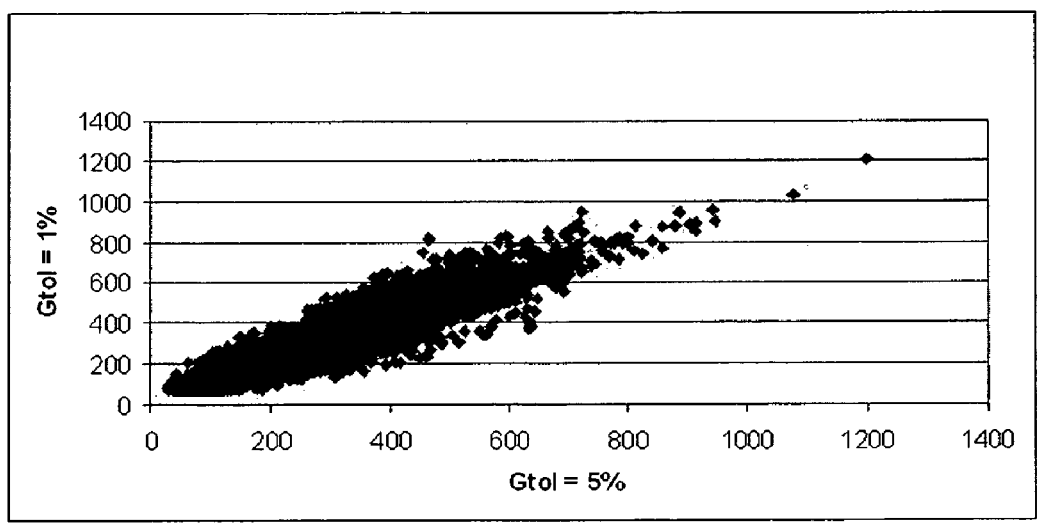

The closer the result to 45% degree line, the more accurate the modeling in virtual aggressor is. FIG. 14A shows the results of the new virtual aggressor method, while the old method is shown in FIG. 14B.

Figure 15:
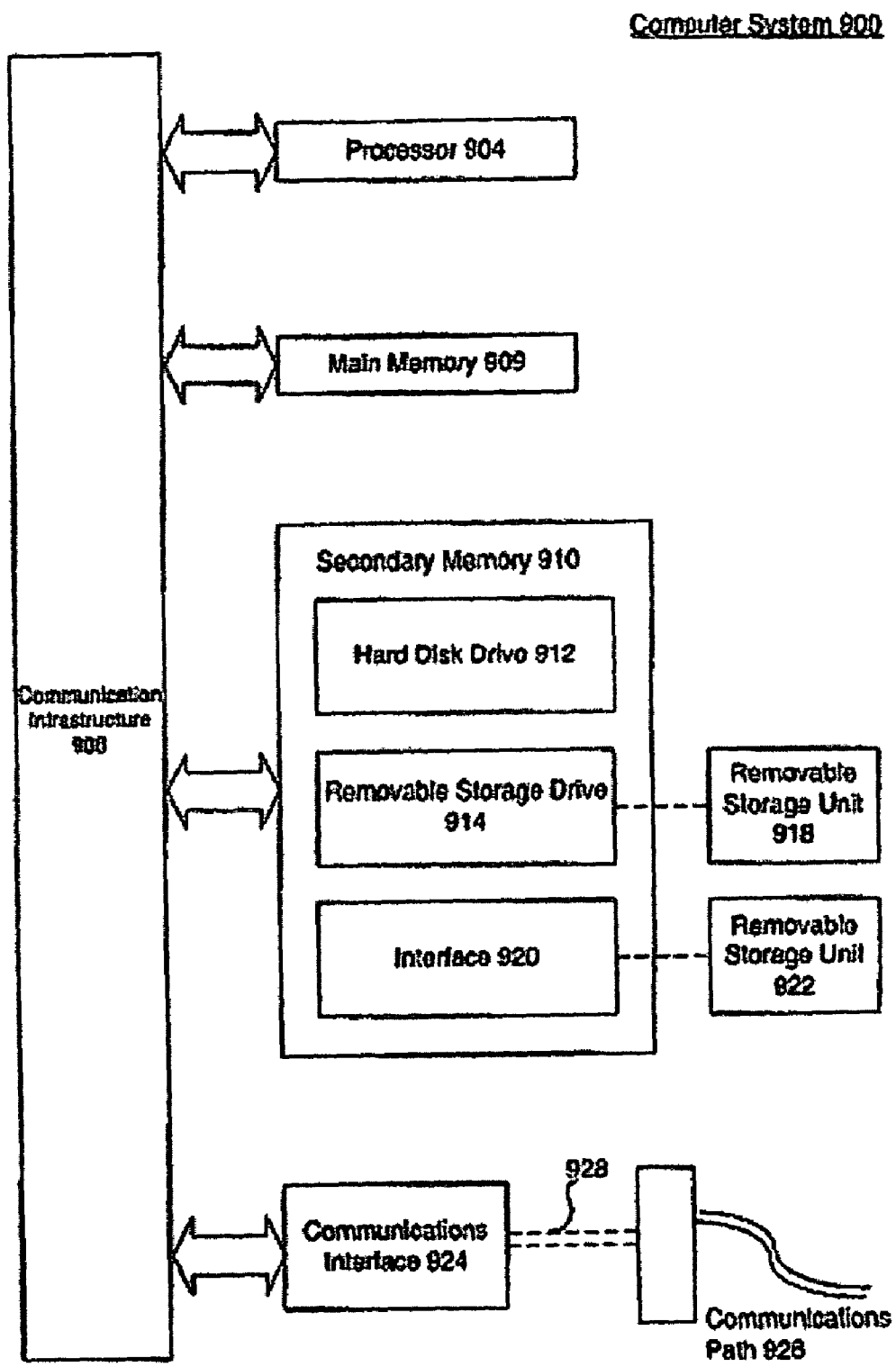
FIG. 15 is an example computer system with which the invention can be implemented in accordance with one embodiment of the invention.

The present invention may be implemented using hardware, software or a combination thereof. In an embodiment of the invention, the processes described herein are implemented in software, such as, for example, as an application program executed on a computer system or other processing system. An example of such a computer system 900 is shown in FIG. 15. The computer system 900 includes one or more processors, such as processor 904. The processor 904 is connected to a communication infrastructure 906, such as a bus or network. After reading this description, it will become apparent to a person skilled in the relevant art how to implement the invention using other computer systems and/or computer architectures.

Computer system 900 can also include a main memory 908, preferably random access memory (RAM) or other dynamic memory, and may also include a secondary memory 910. The secondary memory 910 may include, for example, a hard disk drive 912 and/or a removable storage drive 914. The removable storage drive 914 reads from and/or writes to a removable storage unit 918 in a well known manner. Removable storage unit 918 represents a floppy disk, magnetic tape, optical disk, or other storage medium which is read by and written to by removable storage drive 914. The removable storage unit 918 includes a computer usable storage medium having stored therein computer software and/or data.

In alternative implementations, secondary memory 910 may include other means for allowing computer programs or other instructions to be loaded into computer system 900. Such means may include, for example, a removable storage unit 922 and an interface 920. Examples of such means may include a removable memory chip (such as an EPROM, or PROM) and associated socket, and other removable storage units 922 and interfaces 920 which allow software and data to be transferred from the removable storage unit 922 to computer system 900.

Computer system 900 may also include a communications interface 924. Communications interface 924 allows software and data to be transferred between computer system 900 and external devices. Examples of communications interface 924 may include a modem, a network interface (such as an Ethernet card), a communications port, a PCMCIA slot and card, etc. Software and data transferred via communications interface 924 are in the form of signals 928 which may be electronic, electromagnetic, optical or other signals capable of being received by communications interface 924. These signals 928 are provided to communications interface 924 via a communications path (i.e., channel) 926. This channel 926 carries signals 928 and may be implemented using wire or cable, fiber optics, a phone line, a cellular phone link, an RF link and other communications channels.

In this document, the terms "computer program medium" and "computer usable medium" are used to generally refer to media such as removable storage units 918 and 922, a hard disk installed in hard disk drive 912, and signals 928. These computer program products are means for providing software to computer system 900.

Computer programs (also called computer control logic) are stored in main memory 908 and/or secondary memory 910. Computer programs may also be received via communications interface 924. Such computer programs, when executed, enable the computer system 900 to implement the present invention as discussed herein. In particular, the computer programs, when executed, enable the processor 904 to implement the present invention. Accordingly, such computer programs represent controllers of the computer system 900. Where the invention is implemented using software, the software may be stored in a computer program product and loaded into computer system 900 using removable storage drive 914, hard drive 912 or communications interface 924.

CONCLUSION

While various embodiments of the present invention have been described above, it should be understood that they have been presented by way of example only, and not of limitation. Thus the breadth and scope of the present invention should not be limited by any of the above-described exemplary embodiments. Additionally, the invention is described above in terms of various exemplary embodiments and implementations. It should be understood that the various features and functionality described in one or more of the individual embodiments are not limited in their applicability to the particular embodiment with which they are described, but instead can be applied, alone or in some combination, to one or more of the other embodiments of the invention, whether or not such embodiments are described and whether or not such features are presented as being a part of a described embodiment.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof, and should accordingly be read as examples without limitation; and adjectives such as "conventional," "traditional," "normal," "standard," and terms of similar meaning should not be construed as limiting the item described to a given time period or to an item available as of a given time, but instead should be read to encompass conventional, traditional, normal, or standard technologies that may be available now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

What is claimed is:

1. A method for determining capacitive aggressor-induced crosstalk in a victim net of a stage of an integrated circuit design, comprising:

evaluating, using a computer, an effect of each of multiple capacitive aggressor nets of the stage on the victim net to identify a plurality of capacitive aggressor nets each having an effect on the victim net below a threshold;

combining the identified plurality of capacitive aggressor nets of the stage to construct a virtual capacitive aggressor net of the stage;

determining current waveforms induced on the victim net by individual ones of the plurality of capacitive aggressor nets of the stage; and modeling a current waveform induced by the virtual capacitive aggressor net of the stage on the victim net based on the contribution of the current waveforms determined for the plurality of capacitive aggressor nets of the stage.

2. The method of claim 1, wherein the effect evaluated is a height of a glitch induced on the victim net by a transition in the capacitive aggressor net of the stage.

3. The method of claim 2, wherein the capacitive aggressor net of the stage is included in the virtual capacitive aggressor net if the height of the glitch it induces on the victim net is less than a predetermined factor of the supply voltage.

4. The method of claim 1, wherein modeling the current waveform of the virtual capacitive aggressor comprises combining the current waveforms determined for the plurality of capacitive aggressor nets of the stage.

5. The method of claim 1, wherein modeling the current waveform of the virtual capacitive aggressor of the stage comprises combining the current waveforms of a plurality of small capacitive aggressors of the stage in a piecewise linear fashion.

6. The method of claim 1, wherein modeling the current waveform of the virtual capacitive aggressor of the stage comprises determining a virtual capacitive aggressor function $f_{va}(T)$ such that $$f_{va}(T) = \frac{1}{C_{va}} \int_0^T \left( \sum_{k=1}^n C_k \frac{df_k(t)}{dt} \right) dt,$$

where Cva is the capacitance of the virtual capacitive aggressor, $C_k$ is the capacitance of the k-th of n capacitive aggressors, and $f_k(t)$ is a voltage as a function of time for a transition on the k-th capacitive aggressor.

7. The method of claim 1, further comprising filtering the effects of the capacitive aggressor nets of the stage using time-window filtering.

8. The method of claim 7, wherein filtering comprises determining whether a capacitive aggressor net transition is within a predetermined temporal distance from a time of interest associated with the victim net.

9. The method of claim 7, wherein filtering comprises assuming a worst case scenario for a capacitive aggressor transition with the capacitive aggressor's timing window.

10. The method of claim 1, further comprising accumulating coupling capacitance for the capacitive nets in the virtual capacitive aggressor and filtering the cumulative result by discarding a capacitance that is more than 3-σ away from a Gaussian mean of a switching capacitance.

11. An article of manufacture including a computer readable storage medium storing computer program code for determining capacitive aggressor-induced crosstalk in a victim net of a stage of an integrated circuit design, the program code comprising instructions operable to cause a programmable processor to:
evaluate an effect of each of multiple capacitive aggressor nets of the stage on the victim net to identify a plurality of capacitive aggressor nets each having an effect on the victim net below a threshold;
combine the identified plurality of capacitive aggressor nets of the stage to construct a virtual capacitive aggressor net of the stage;
determine current waveforms induced on the victim net by individual ones of the plurality of capacitive aggressor nets of the stage;
and model a current waveform induced by the virtual capacitive aggressor net on the victim net based on the contribution of the current waveforms determined for the plurality of capacitive aggressor nets of the stage.

12. The article of claim 11, wherein the effect evaluated is a height of a glitch induced on the victim net by a transition in the capacitive aggressor net of the stage.

13. The article of claim 11, wherein the instructions operable to cause a programmable processor to model the current waveform of the virtual capacitive aggressor of the stage comprises instructions operable to cause a programmable processor to combine the current waveforms of a plurality of small capacitive aggressors.

14. The article of claim 11, wherein the program further comprises instructions operable to cause a programmable processor to filter the effects of the capacitive aggressor nets of the stage using time-window filtering.

15. The article of claim 14, wherein the instructions operable to cause a programmable processor to filter the effects of the capacitive aggressor nets of the stage comprise at least one of instructions operable to cause a programmable processor to determine whether a capacitive aggressor net transition is within a predetermined temporal distance from a time of interest associated with the victim net, instructions operable to cause a programmable processor to assume a worst case scenario for a capacitive aggressor transition with a capacitive aggressor's timing window, and instructions operable to cause a programmable processor to accumulate the coupling capacitance for the capacitive aggressor nets of the stage in the virtual capacitive aggressor and filter the cumulative result by discarding a capacitance that is more than 3-0 away from a Gaussian mean of a switching capacitance.

16. A system comprising:
means for evaluating an effect of each of multiple capacitive aggressor nets of the stage on the victim net to identify a plurality of capacitive aggressor nets each having an effect on the victim net below a threshold;
means for combining the identified plurality of capacitive aggressor nets of the stage to construct a virtual capacitive aggressor net of the stage;
means for determining current waveforms induced on the victim net by individual ones of the plurality of capacitive aggressor nets of the stage; and
means for modeling a current waveform induced by the virtual capacitive aggressor net on the victim net based on the contribution of the current waveforms determined for the plurality of capacitive aggressor nets of the stage.

17. The system of claim 16, wherein the effect evaluated is a height of a glitch induced on the victim net by a transition in the capacitive aggressor net of the stage.

18. The system of claim 16, further comprising means for filtering the effects of the capacitive aggressor nets of the stage using time-window filtering.

19. The system of claim 18, wherein the means for filtering further comprises means for determining whether a capacitive aggressor net transition is within a predetermined temporal distance from a time of interest associated with the victim net.

* * * * *